(12) United States Patent
Enomoto et al.

(10) Patent No.: US 9,748,296 B2
(45) Date of Patent: Aug. 29, 2017

(54) SOLID-STATE IMAGING DEVICE, METHOD FOR PRODUCING SOLID-STATE IMAGING DEVICE AND ELECTRONIC APPARATUS

(71) Applicant: SONY CORPORATION, Tokyo (JP)

(72) Inventors: Takayuki Enomoto, Kanagawa (JP); Yoshiki Ebiko, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/417,590

(22) PCT Filed: Jul. 25, 2013

(86) PCT No.: PCT/JP2013/004534
§ 371 (c)(1),
(2) Date: Jan. 27, 2015

(87) PCT Pub. No.: WO2014/020871
PCT Pub. Date: Feb. 6, 2014

(65) Prior Publication Data
US 2015/0221692 A1    Aug. 6, 2015

(30) Foreign Application Priority Data

Aug. 3, 2012   (JP) ................................. 2012-173188

(51) Int. Cl.
*H01L 23/62* (2006.01)
*H01L 27/146* (2006.01)

(52) U.S. Cl.
CPC .... *H01L 27/14623* (2013.01); *H01L 27/1463* (2013.01); *H01L 27/1464* (2013.01);
(Continued)

(58) Field of Classification Search
CPC .......... H01L 25/167; H01L 27/14643–27/156; H01L 27/3227; H01L 31/02024;
(Continued)

(56) References Cited

U.S. PATENT DOCUMENTS

| 6,118,142 A * | 9/2000 | Chen ................. H01L 21/76224 257/232 |
| 2006/0081890 A1* | 4/2006 | Kang ................. H01L 27/14623 257/233 |

(Continued)

FOREIGN PATENT DOCUMENTS

| CN | 1877846 | 12/2006 |
| CN | 101847643 | 9/2010 |

(Continued)

OTHER PUBLICATIONS

International Search Report and Written Opinion prepared by the European Patent Office on Sep. 27, 2013, for International Application No. PCT/JP2013/004534.

(Continued)

*Primary Examiner* — Cuong B Nguyen
(74) *Attorney, Agent, or Firm* — Sheridan Ross P.C.

(57) ABSTRACT

A solid-state imaging device, method for producing solid-state imaging device and electronic apparatus are provided. The solid-state imaging device includes a substrate, with a plurality of pixels formed in the substrate. In addition, a plurality of groups are formed in the substrate, and in particular in pixel isolation regions between adjacent pixels. The grooves extend from a first surface of the substrate towards a second surface of the substrate. An embedded film extends into the grooves. At least some of the grooves include a first stage near the first surface of the substrate and a second stage near the second surface of the substrate that are defined by walls of the grooves, wherein the first stage is wider than the second stage, and wherein a step is present between the first and second stages. In addition, the device includes a light shielding film adjacent the first surface of the substrate that overlies the grooves. A portion of the light (Continued)

shielding film is embedded in the embedded film that extends into the grooves.

19 Claims, 37 Drawing Sheets

(52) U.S. Cl.
 CPC .. *H01L 27/14607* (2013.01); *H01L 27/14612* (2013.01); *H01L 27/14643* (2013.01); *H01L 27/14689* (2013.01)

(58) Field of Classification Search
 CPC ............. H01L 31/0203; H01L 31/1032; H01L 31/107; H01L 27/14623; H01L 27/14607; H01L 27/14689; H01L 27/1464; H01L 27/14612; H01L 27/1463
 See application file for complete search history.

(56) References Cited

U.S. PATENT DOCUMENTS

| | | | |
|---|---|---|---|
| 2006/0273359 A1* | 12/2006 | Mori | H01L 27/1463 257/291 |
| 2007/0210395 A1 | 9/2007 | Maruyama | |
| 2008/0297634 A1 | 12/2008 | Uya | |
| 2010/0144084 A1 | 6/2010 | Doan et al. | |
| 2010/0201834 A1* | 8/2010 | Maruyama | H01L 27/1464 348/222.1 |
| 2010/0237451 A1* | 9/2010 | Murakoshi | H01L 27/1463 257/432 |
| 2012/0012965 A1 | 1/2012 | Maeda | |
| 2012/0018617 A1* | 1/2012 | Miyanami | H01L 27/1463 250/208.1 |
| 2012/0153128 A1* | 6/2012 | Roy | H01L 27/14609 250/208.1 |
| 2012/0217602 A1* | 8/2012 | Enomoto | H01L 27/14614 257/432 |
| 2013/0285181 A1* | 10/2013 | Lin | H01L 27/1463 257/432 |

FOREIGN PATENT DOCUMENTS

| | | |
|---|---|---|
| JP | 2005-294647 | 10/2005 |
| JP | 2006-344644 | 12/2006 |
| JP | 2009 088030 A | 4/2009 |
| JP | 2010-186818 | 8/2010 |
| JP | 2011-003860 | 1/2011 |

OTHER PUBLICATIONS

Official Action (no English translation available) for Japanese Patent Application No. 2012-173188 mailed Apr. 26, 2016, 10 pages.

Official Action (with English translation) for Chinese Patent Application No. 201380039862.9 dated Nov. 21, 2016, 21 pages.

\* cited by examiner

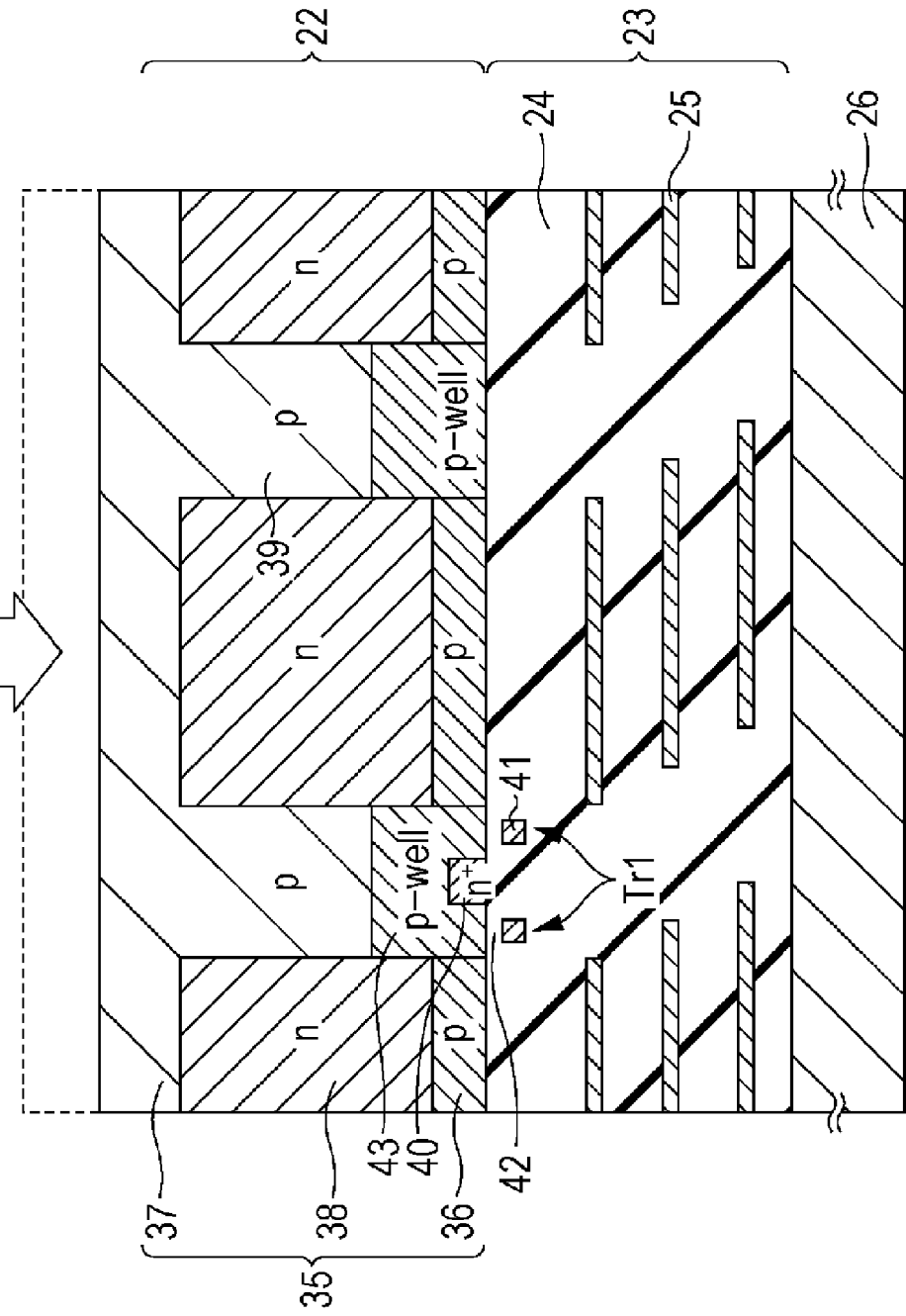

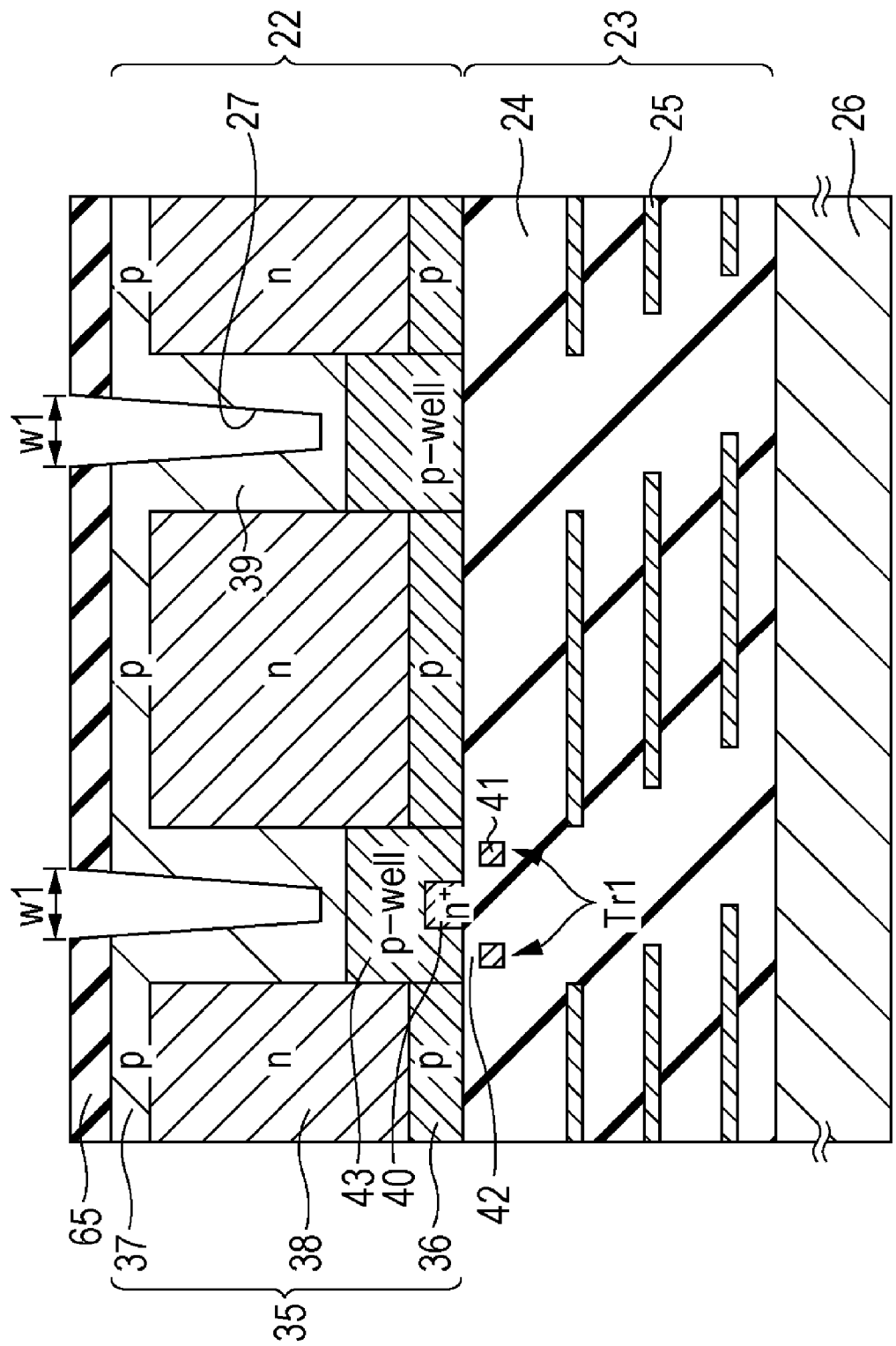

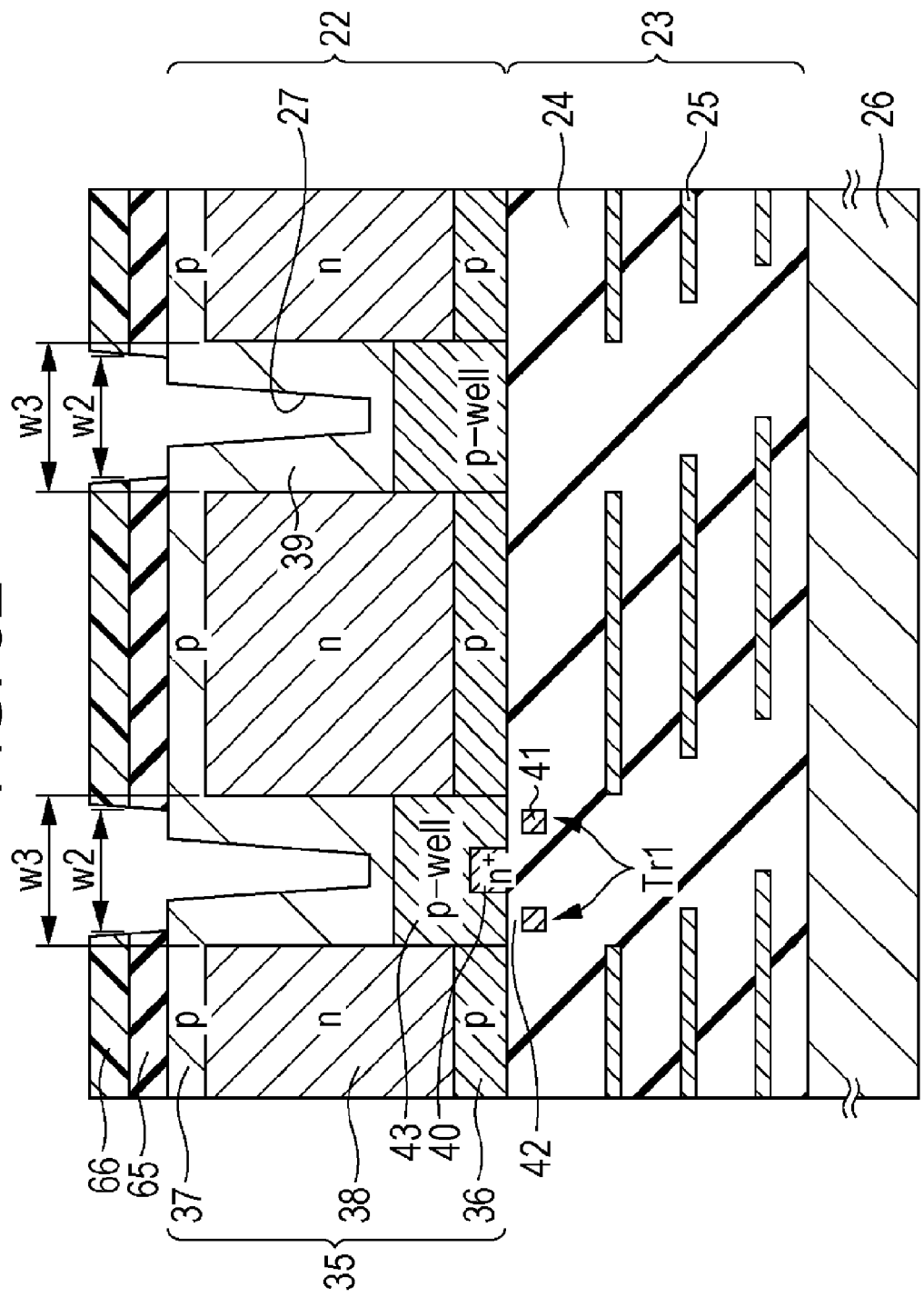

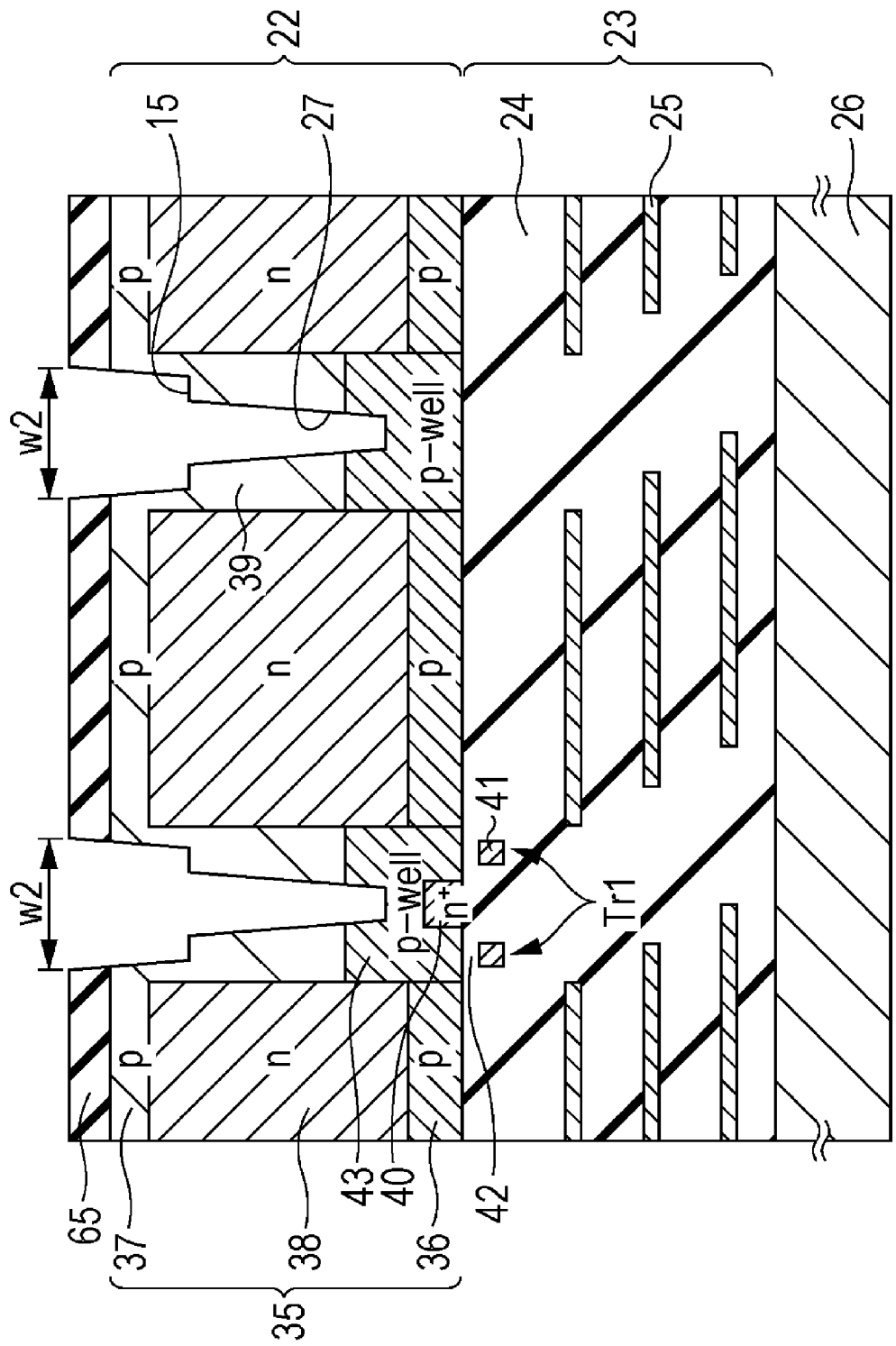

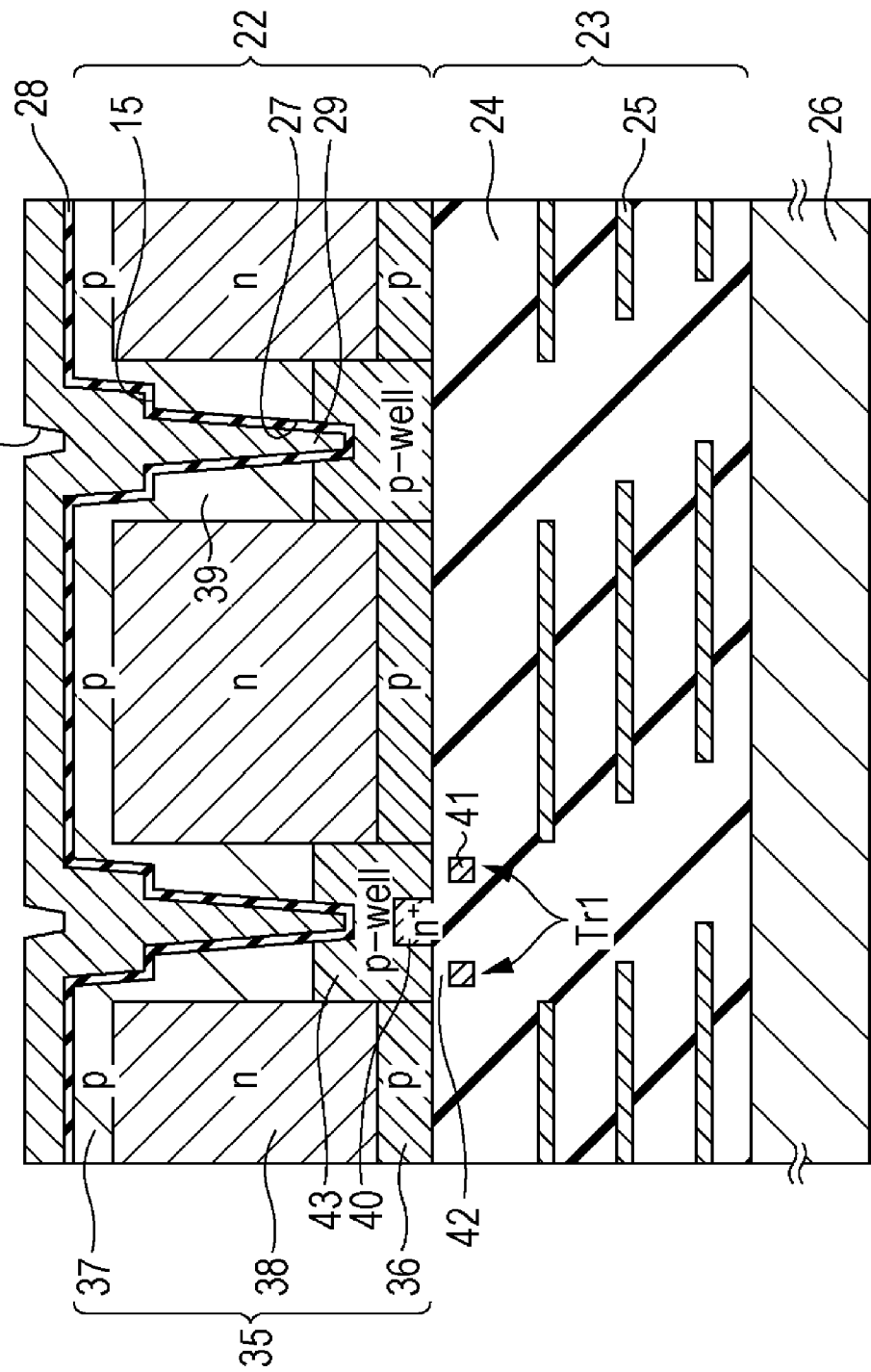

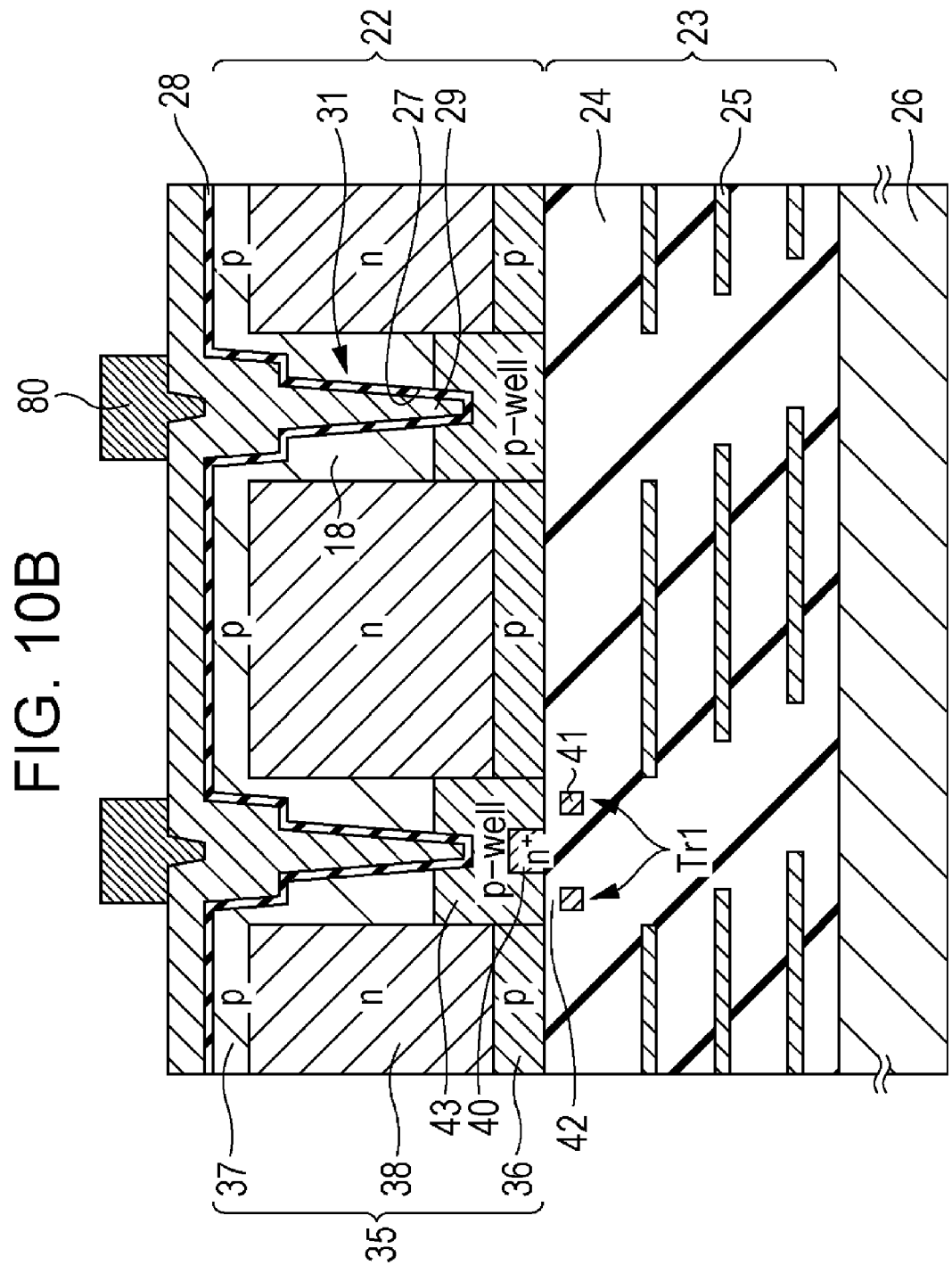

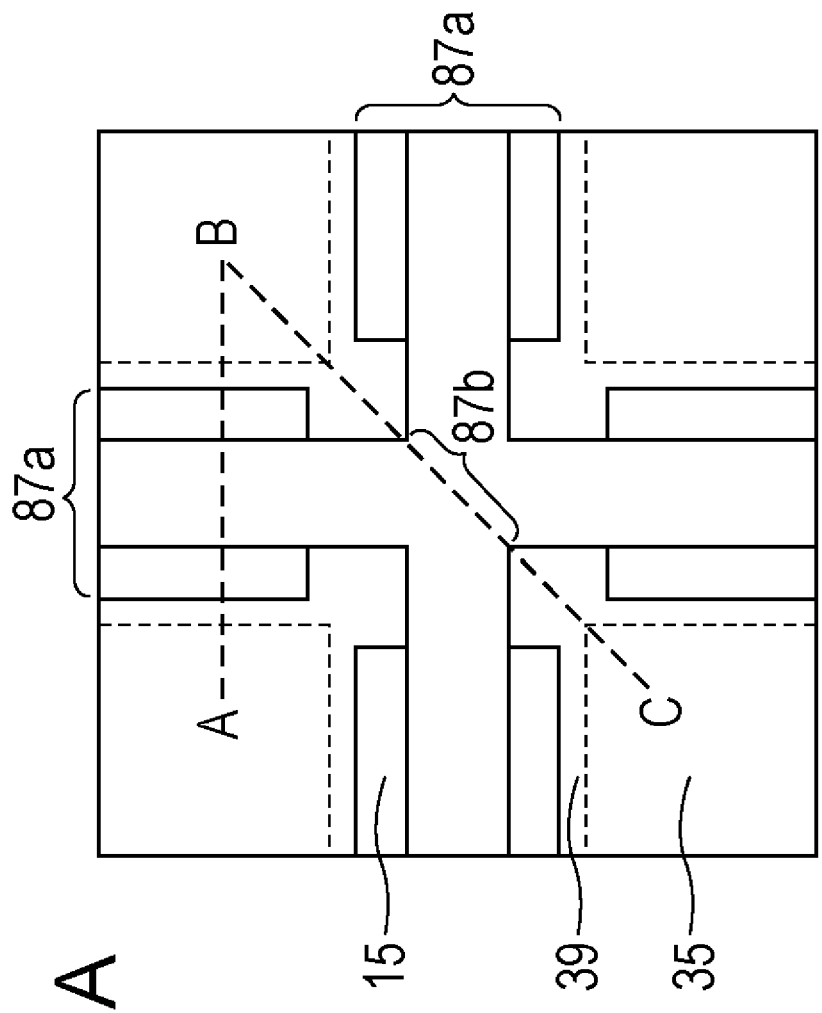

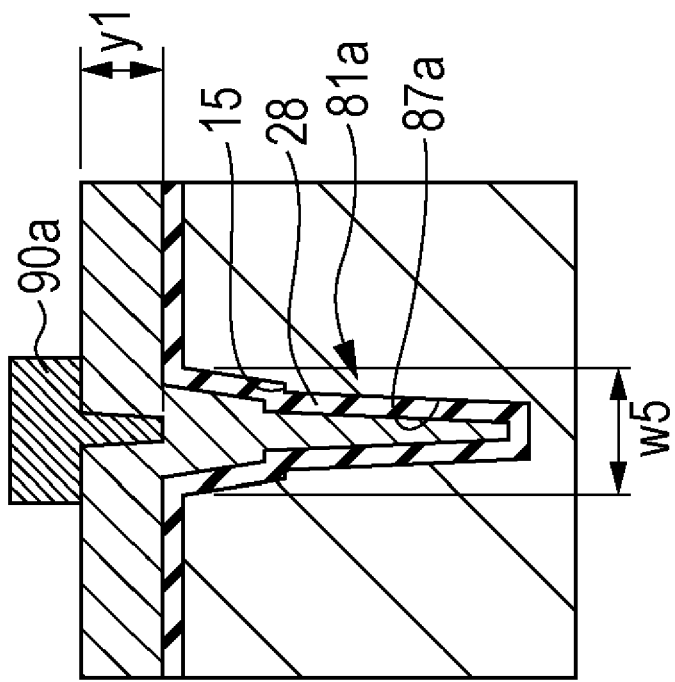

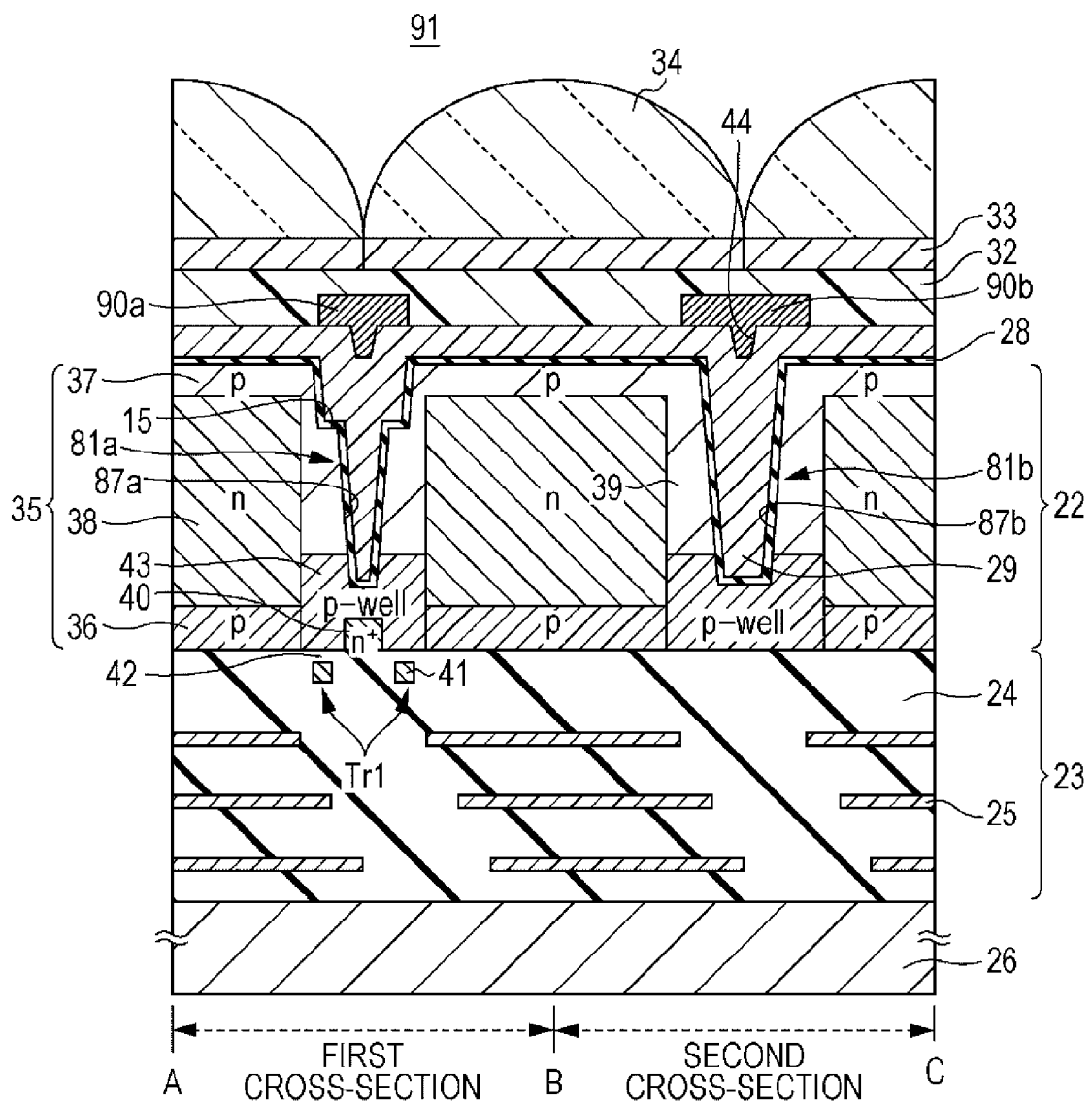

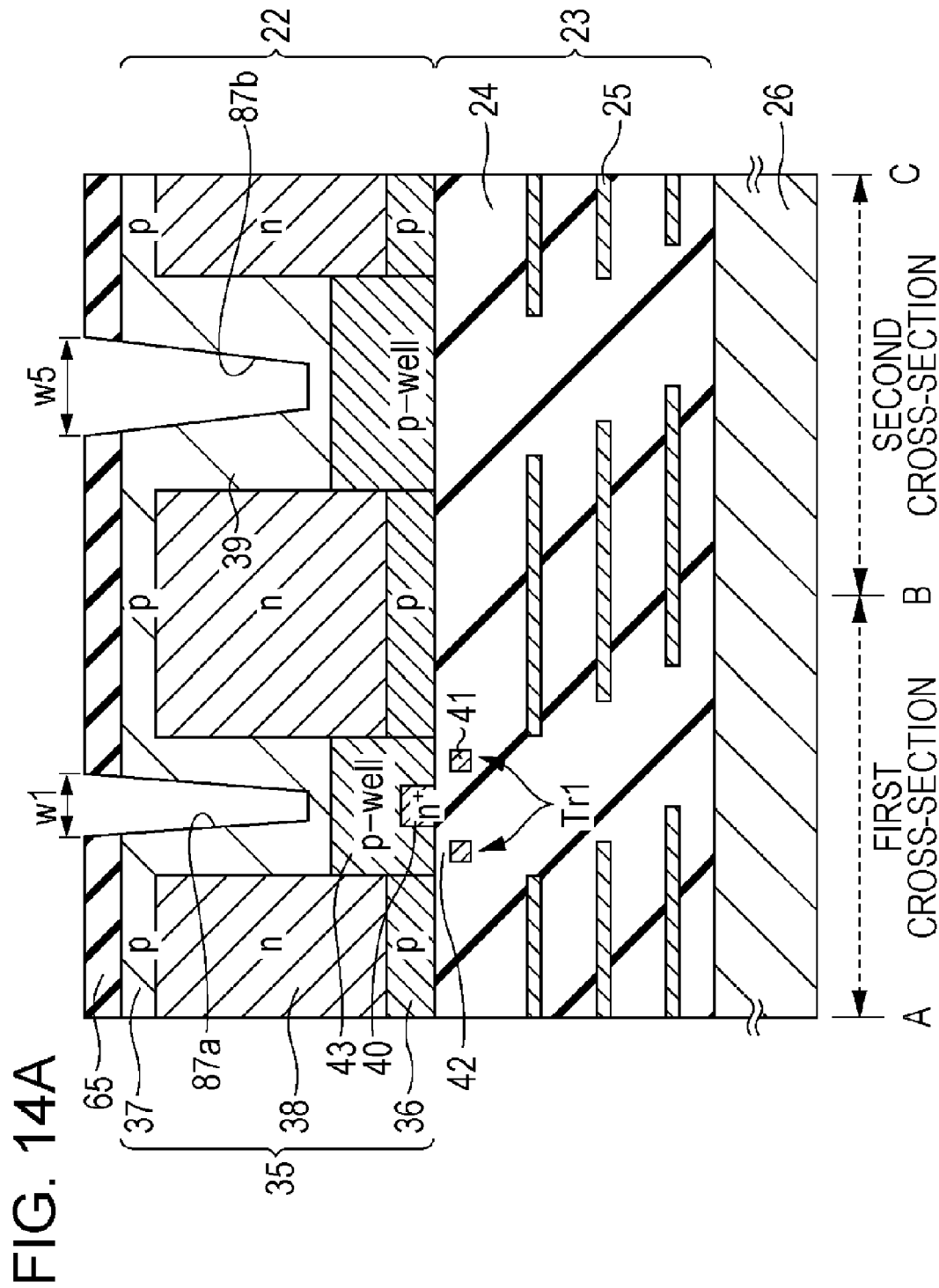

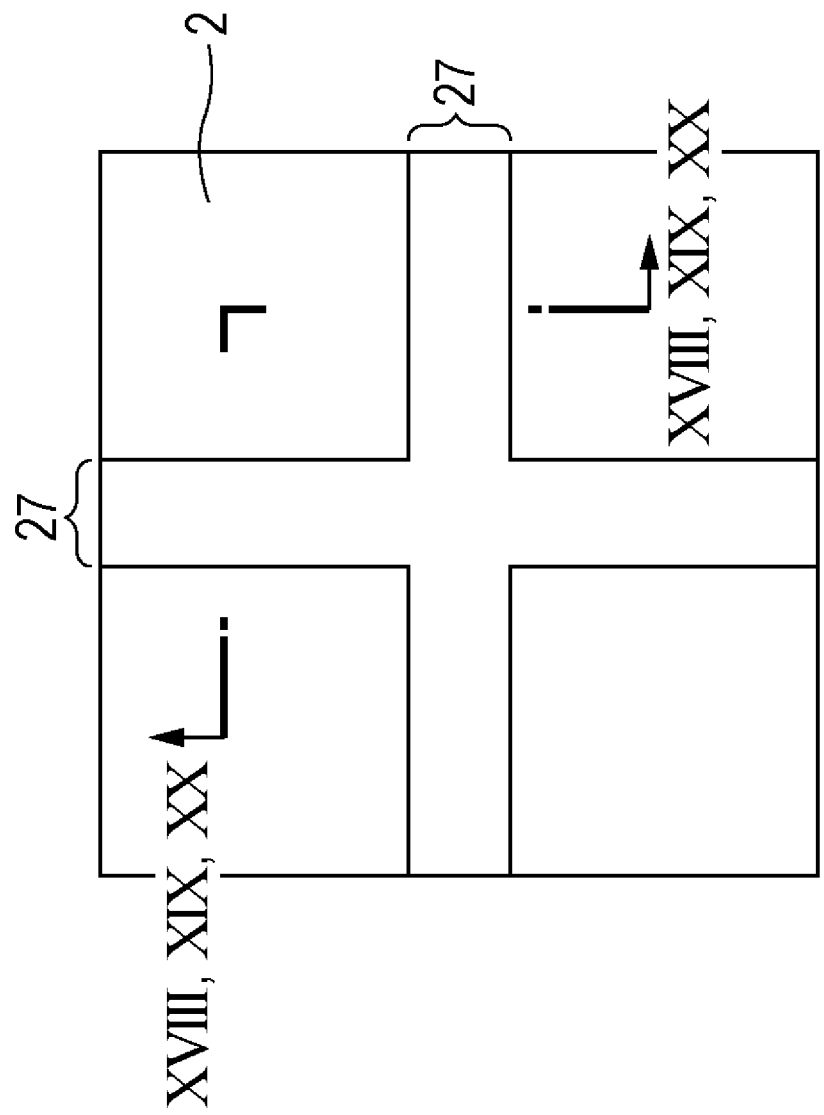

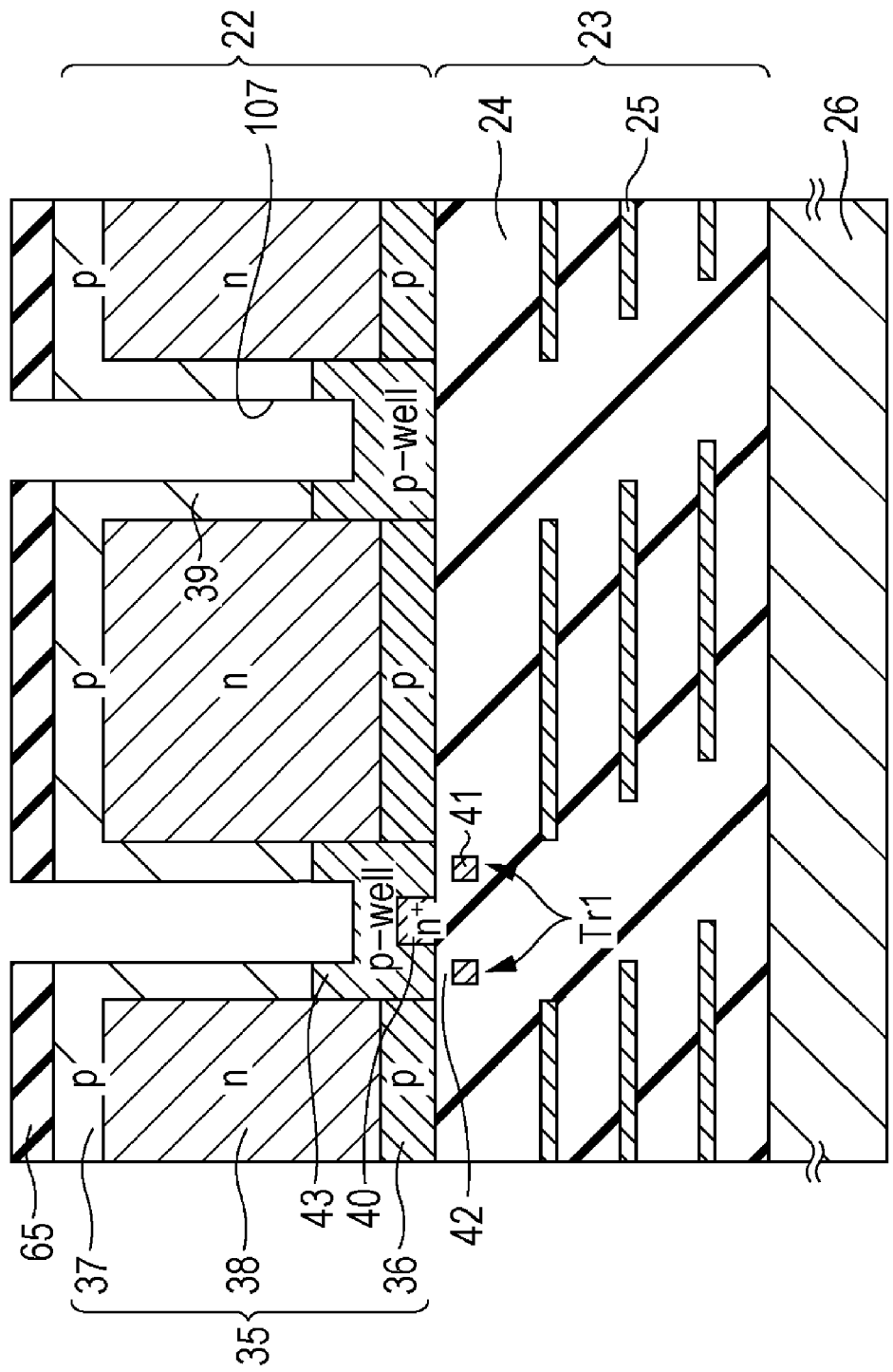

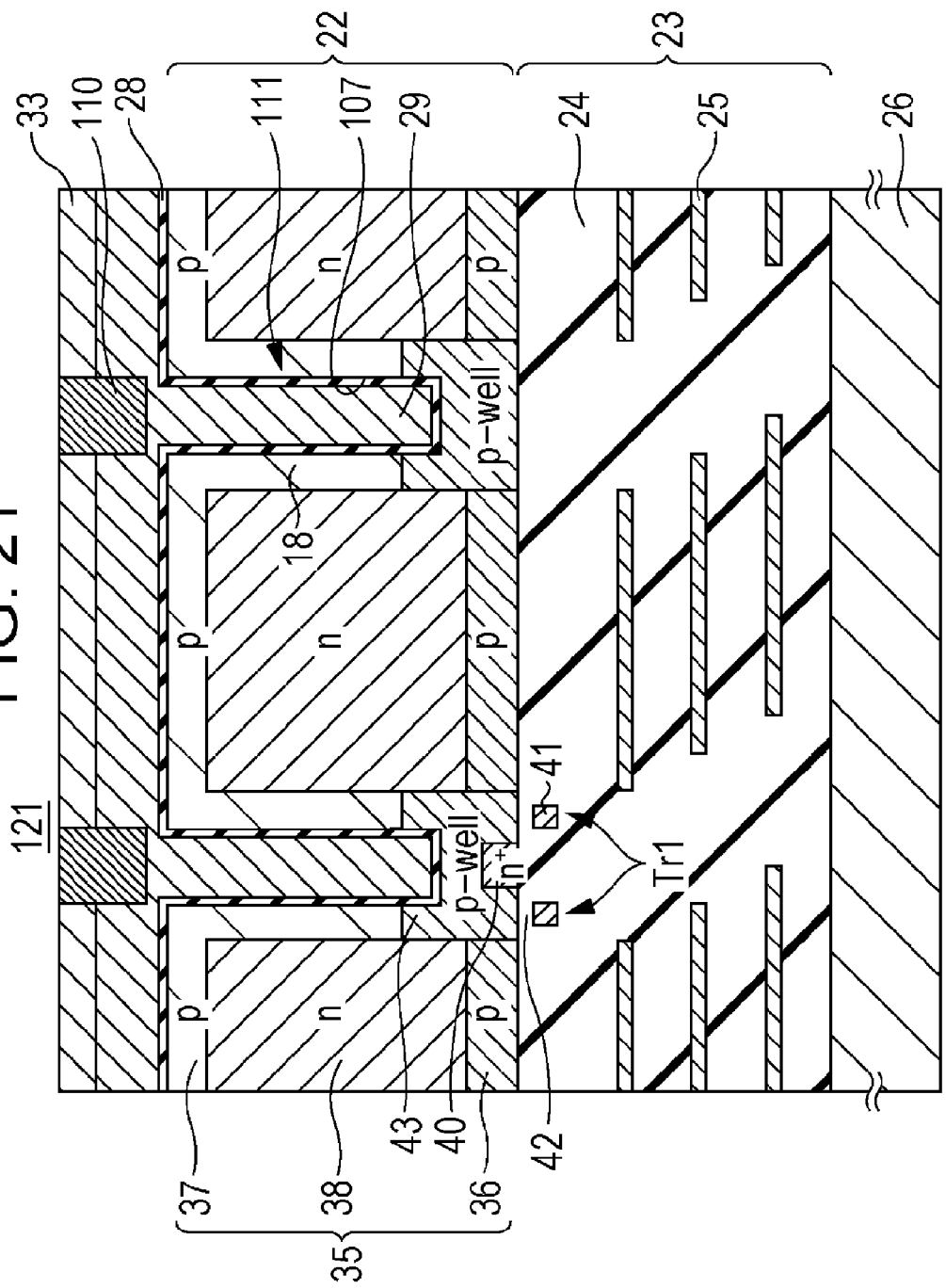

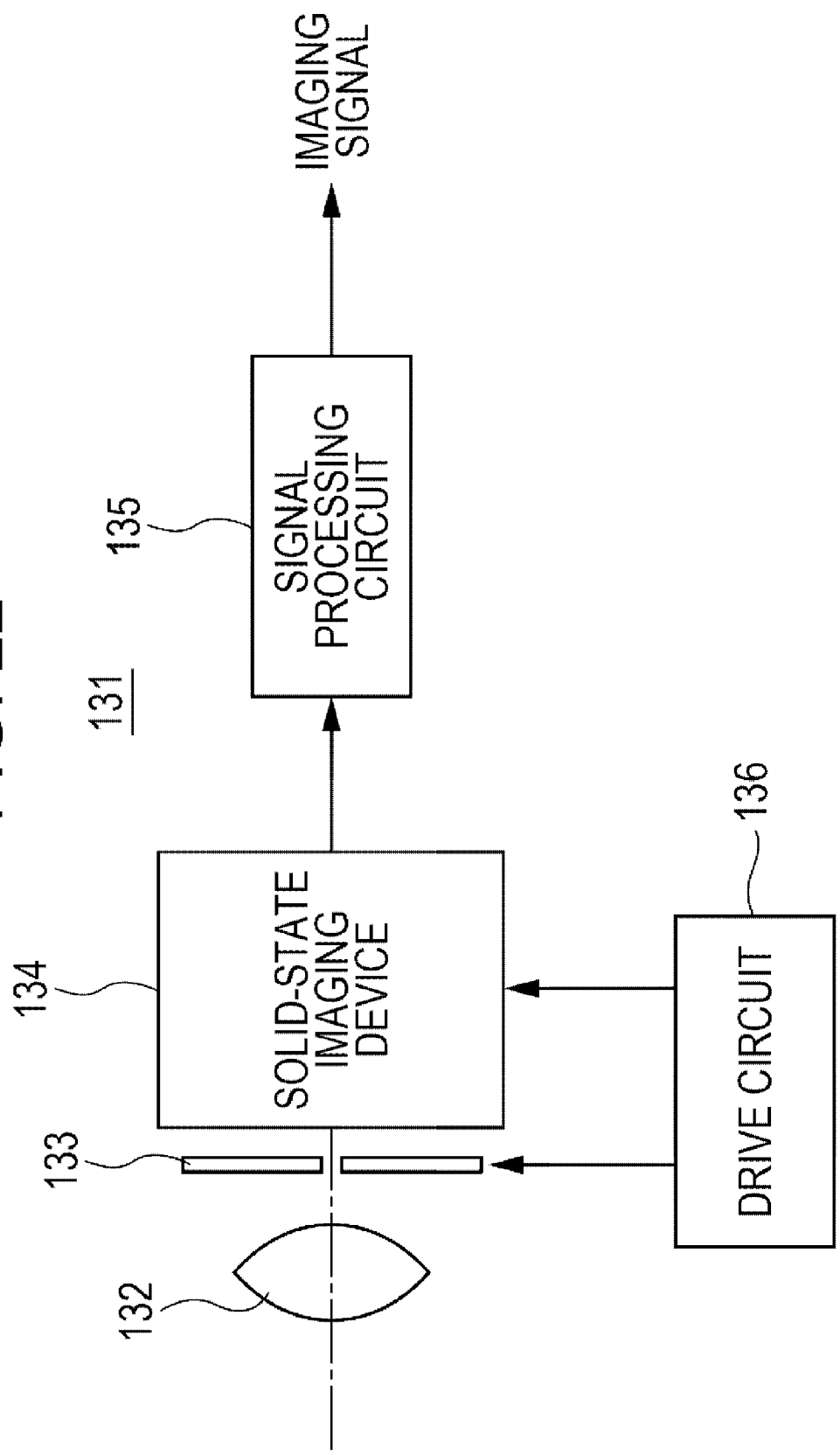

SOLID-STATE IMAGING DEVICE, METHOD FOR PRODUCING SOLID-STATE IMAGING DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2013/004534 having an international filing date of Jul. 25, 2013, which designated the United States, which PCT application claimed the benefit of Japanese Patent Application No. 2012-173188 filed Aug. 3, 2012, the disclosures of which are incorporated herein by reference in their entirety.

FIELD

The present disclosure relates to a backside-illuminated solid-state imaging device, a method for producing the same and an electronic apparatus.

BACKGROUND

In recent years, backside-illuminated solid-state imaging devices, in which light is irradiated from the side opposite the side on which a wiring layer is formed on a substrate, have been proposed. In backside-illuminated solid-state imaging devices, since the wiring layer and a circuit element are not formed on the side of the light irradiation surface, in addition to it being possible to increase the aperture ratio of a light receiving section which is formed on the substrate, it is possible to achieve an improvement in sensitivity without input light being reflected by the wiring layer as the input light is input into the light receiving section. In addition, it is possible to apply the backside-illumination structure to a CCD (Charge Coupled Device) solid-state imaging device and a CMOS (Complementary Metal Oxide Semiconductor) solid-state imaging device.

Input light is applied at a main beam angle that is dependent on the pupil position and brightness (FF value) of the imaging lens of the camera, and is input with the expanse of a vertical light beam angle. As a result of this, diagonal input light that has passed through color filters of other pixels is input into the light receiving section of a different pixel and undergoes photoelectric conversion causing the problems of optical color mixing and a deterioration in sensitivity.

In order to reduce optical color mixing, in another approach, a light shielding film is provided through an insulation layer at the pixel border of the light receiving surface on which a photoelectric conversion section is arranged.

In such a case, it is preferable to form the light shielding film between the light receiving sections of the back surface side of the substrate that form the light input sides, but since the distance between the substrate and the surface of a collecting lens increases in proportion with the height of the light shielding film, there is a possibility that degradations in focusing property will be caused. In addition, there is concern optical color mixing will be caused as a result of diagonal input light from an insulation film that is positioned between a substrate on which a photoelectric conversion section is provided and a light shielding film.

SUMMARY

There is a demand for an improvement in focusing property and further improvements in characteristics such as a reduction in optical color mixing in this type of solid-state imaging device.

It is desirable to provide a solid-state imaging device and a method for producing thereof which achieve an improvement in focusing property and in which characteristics such as a reduction in optical color mixing are further improved. In addition, it is desirable to provide an electronic apparatus that uses the solid-state imaging device.

According to the present disclosure, it is possible to achieve an improvement in focusing property and it is possible to achieve further improvements in characteristics such as a reduction in optical color mixing in a solid-state imaging device. In addition, according to the method for producing a solid-state imaging device according to embodiments of the present disclosure, it is possible to achieve an improvement in focusing property and it is possible to produce a solid-state imaging device which achieves further improvements in characteristics such as a reduction in optical color mixing. Furthermore, as a result of using the solid-state imaging device, it is possible to obtain an electronic apparatus which achieves an improvement in image quality.

BRIEF DESCRIPTION OF DRAWINGS

FIG. 5C is a process drawing (2 of 4) that show a method for producing a solid-state imaging device according to the first embodiment of the present disclosure;

FIG. 5D is a process drawing (2 of 4) that shows a method for producing a solid-state imaging device according to the first embodiment of the present disclosure;

FIG. 6E is a process drawing (3 of 4) that shows a method for producing a solid-state imaging device according to the first embodiment of the present disclosure;

FIG. 6F is a process drawing (3 of 4) that shows a method for producing a solid-state imaging device according to the first embodiment of the present disclosure;

FIG. 7G is a process drawing (4 of 4) that shows a method for producing a solid-state imaging device according to the first embodiment of the present disclosure;

FIG. 10B is a process drawing that shows a method for producing a solid-state imaging device according to a modified example;

FIG. 12A is a planar layout of the central portion of a region that includes four pixels of the solid-state imaging device according to a second embodiment of the present disclosure;

FIG. 12B is a cross section configuration drawing along the line A-B in FIG. 12A;

FIG. 13 is a cross section configuration drawing along the line A-B-C in FIG. 12A;

FIG. 14A is a process drawing (1 of 2) that shows a method for producing a solid-state imaging device according to the second embodiment of the present disclosure;

FIG. 17 is a planar layout of the central portion of a region that includes four pixels of the solid-state imaging device according to a third embodiment of the present disclosure;

FIG. 19A is a process drawing (1 of 2) that shows a method for producing a solid-state imaging device according to the third embodiment of the present disclosure;

FIG. 21 is a cross section configuration drawing of the main portions of a solid-state imaging device according to a modification example; and FIG. 22 is a cross section configuration drawing of an electronic apparatus according to a fourth embodiment of the present disclosure.

DETAILED DESCRIPTION

Hereinafter, an example of a solid-state imaging device, a method for producing a solid-state imaging device and an electronic apparatus according to an embodiment of the present disclosure will be described with reference to FIG. 1 to FIG. 22. The embodiments of the present disclosure will be described in the order indicated below. Additionally, the present disclosure is not limited to the examples indicated below.

Figure 1:
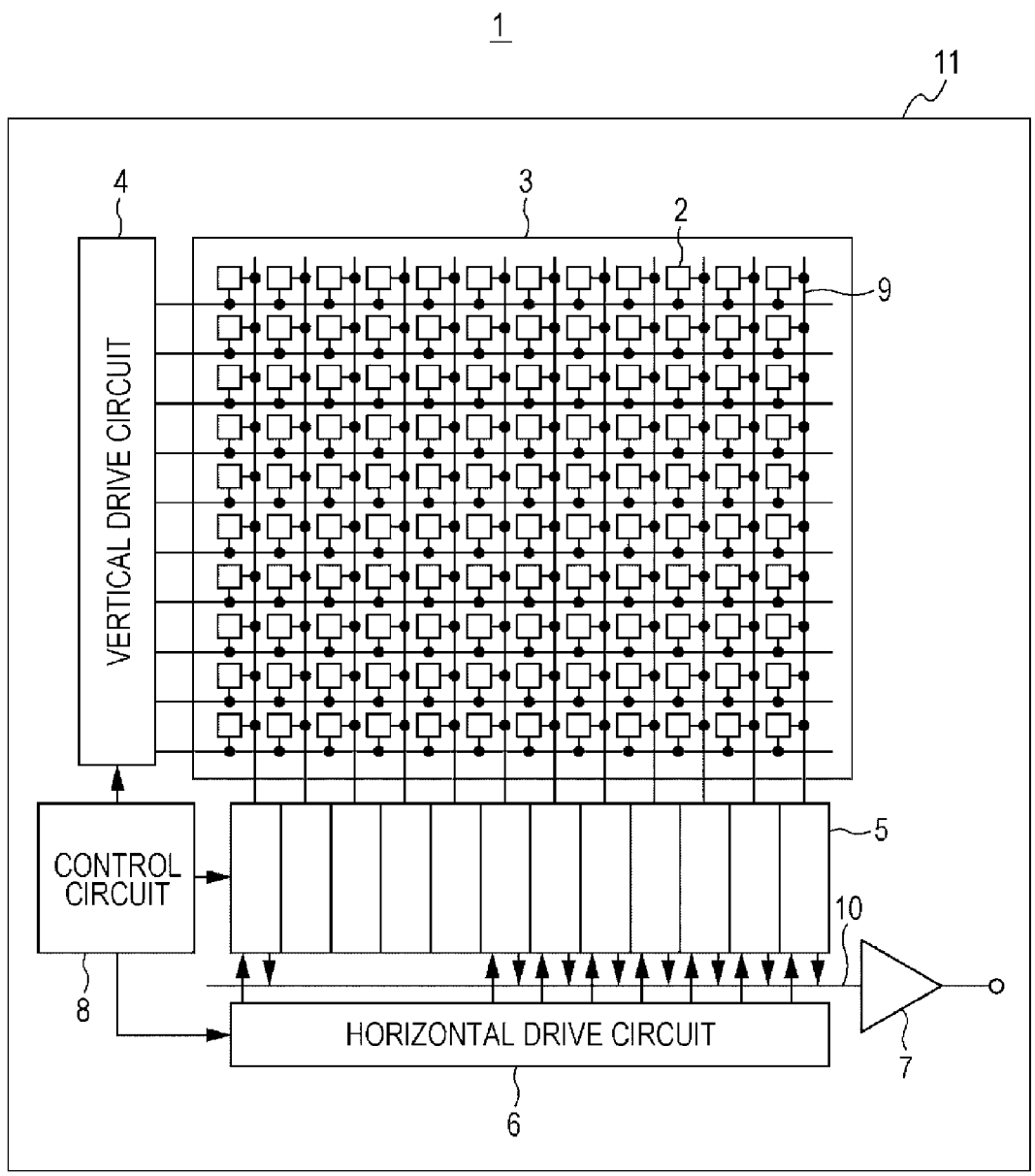
FIG. 1 is a schematic configuration drawing that shows the entirety of a solid-state imaging device according to a first embodiment of the present disclosure.

1. First Embodiment: Solid-State Imaging Device
1-1 Overall Configuration of Solid-State Imaging Device
1-2 Configuration of Main Portions
1-3 Method for Producing Solid-State Imaging Device
1-4 Comparative Example
1-5 Modification Example
1-6 Method for Producing Solid-State Imaging Device according to Modification Example
2. Second Embodiment: Solid-State Imaging Device
2-1 Configuration of Main Portions
2-2 Method for Producing Solid-State Imaging Device
3. Third Embodiment: Solid-State Imaging Device
3-1 Configuration of Main Portions
3-2 Method for Producing Solid-State Imaging Device
3-3 Modification Example
4. Fourth Embodiment: Electronic Apparatus First Embodiment: Solid-State Imaging Device 1-1 Overall Configuration of Solid-State Imaging Device FIG. 1 is a schematic configuration drawing that shows the entirety of a solid-state imaging device 1 according to a first embodiment of the present disclosure. The solid-state imaging device 1 of the present embodiment is configured to include a pixel region 3 that is configured by a plurality of pixels 2 that are arranged on a substrate 11 that is formed from silicon, a vertical drive circuit 4, a column signal processing circuit 5, a horizontal drive circuit 6, an output circuit 7, a control circuit 8 and the like.

The pixels 2 are configured by a photoelectric conversion section formed from a photodiode and a plurality of MOS transistors, and a plurality thereof are regularly arranged on the substrate 11 in a two-dimensional array. The MOS transistors that configure the pixels 2 may be four MOS transistors configured by a transfer transistor, a reset transistor, a selection transistor and an amplifier transistor or may be three transistors with the selection transistor omitted.

The pixel region 3 is configured by the pixels 2 being regularly arranged in a two-dimensional array. The pixel region 3 is configured by an effective pixel region that receives light in a practical sense and reads a signal charge created through photoelectric conversion to the column signal processing circuit 5 by amplifying the signal charge and a black reference pixel region (not shown in the drawing) for outputting an optical black that forms a black level reference. The black reference pixel region is normally formed at the periphery of the effective pixel region.

The control circuit 8 generates a clock signal and a control signal that form references for the operations of the vertical drive circuit 4, the column signal processing circuit 5, the horizontal drive circuit 6 and the like on the basis of a vertical synchronization signal, a horizontal synchronization signal and a master clock signal. Further, the clock signal and control signal and the like that are generated by the a control circuit 8 are input into the vertical drive circuit 4, the column signal processing circuit 5, the horizontal drive circuit 6 and the like.

The vertical drive circuit 4 is configured by a shift transistor for example, and selectively scans each pixel 2 of the pixel region 3 one lime at a time in a sequential vertical direction. Further, in the photodiode of each pixel 2, a pixel signal is supplied to the column signal processing circuit 5 through a vertical signal line on the basis of the signal charge that is generated depending on the amount of light received.

The column signal processing circuit 5 is, for example, disposed in each column of pixels 2, and performs signal processes such as noise removal and signal amplification of the signal output from one row of pixels 2 for each column of pixels according to the signal from the black reference pixel region (not shown in the drawing, but this component is formed at the periphery of the effective pixel region). In the output stage of the column signal processing circuit 5, a horizontal selection switch (not shown in the drawing) is provided between a horizontal signal line 10 and the column signal processing circuit 5.

The horizontal drive circuit 6 is configured by a shift transistor for example, sequentially selects each column signal processing circuit 5 by sequentially outputting a horizontal scanning pulse and outputs a pixel signal from each column signal processing circuit 5 to the horizontal signal line 10.

The output circuit 7 performs signal processes on the signals sequentially supplied from each column signal processing circuit 5 through the horizontal signal line 10 and outputs the signals.

1-2 Configuration of Main Portions

Figure 2:
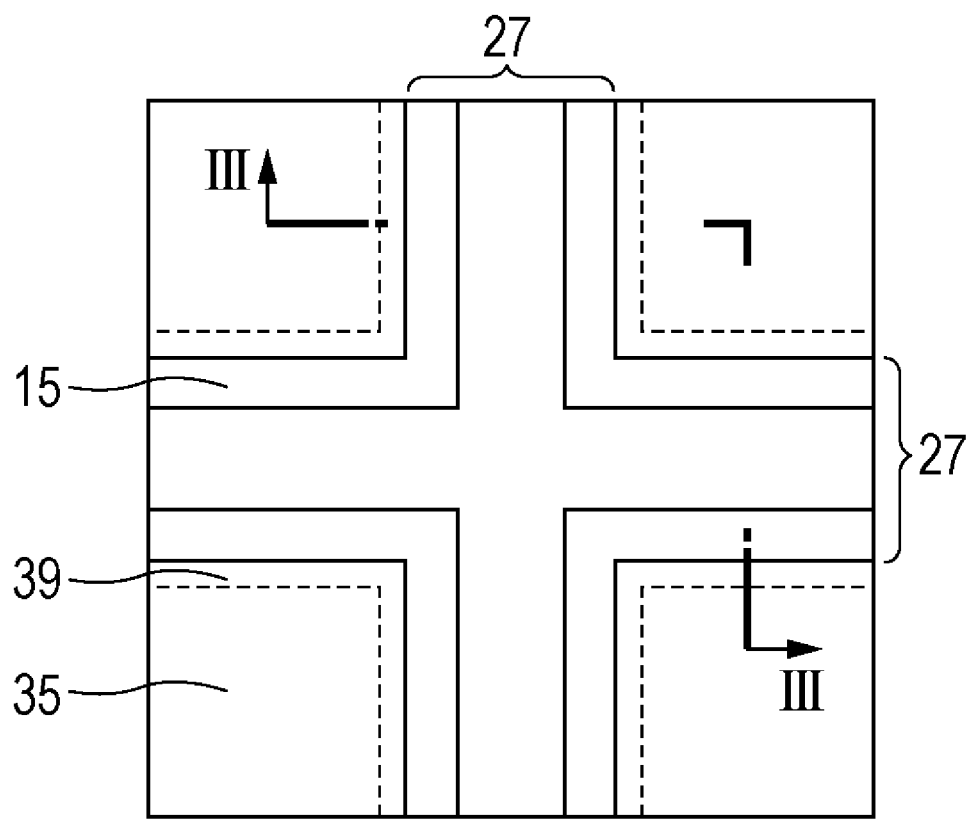
FIG. 2 is a planar layout of the central portion of a region that includes four pixels of the solid-state imaging device according to the first embodiment of the present disclosure.
Figure 3:
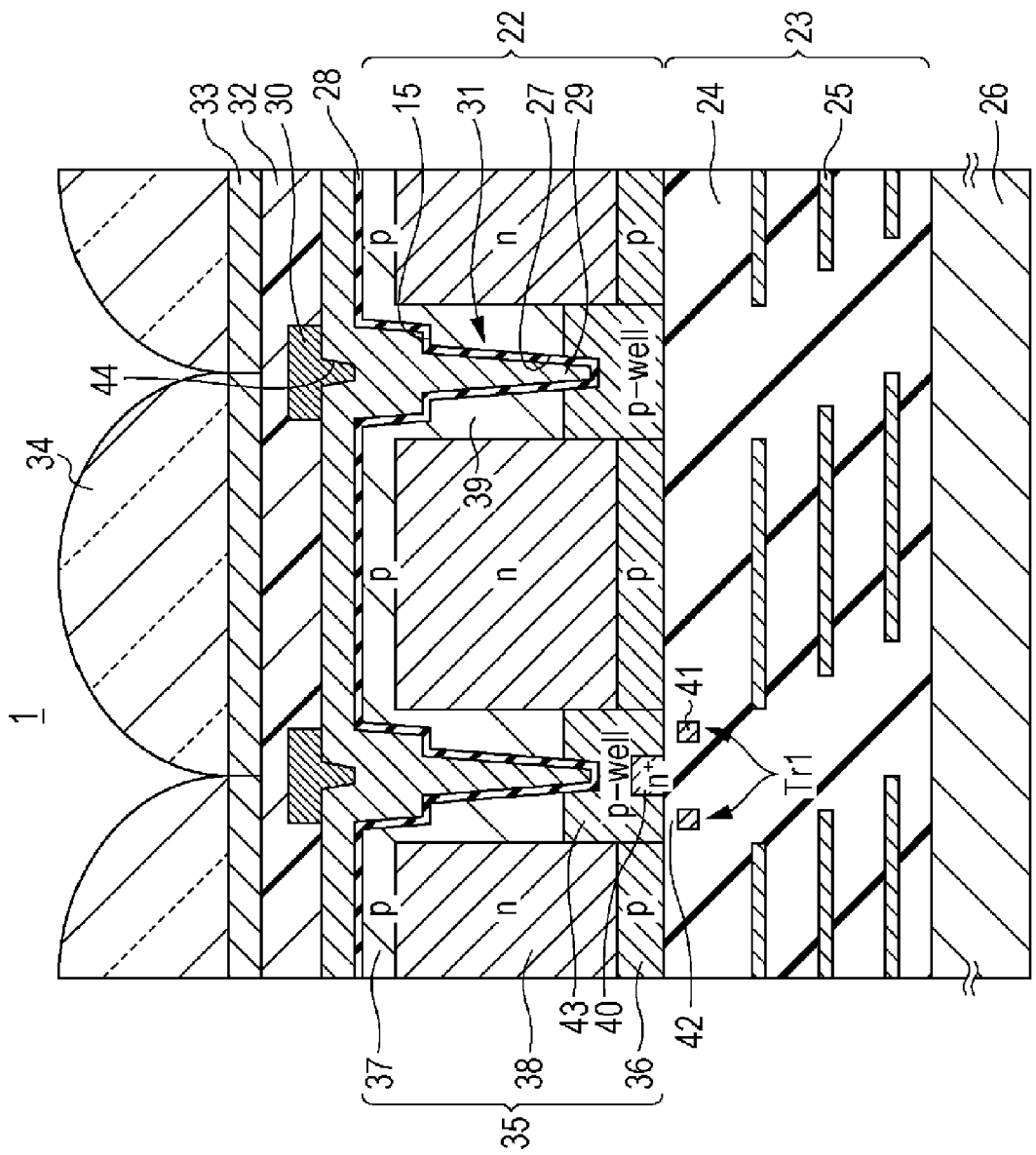
FIG. 3 is a cross section configuration drawing along the line III-III in FIG. 2.

FIG. 2 is a planar layout of the central portion of a region that includes four pixels that are adjacent in the vertical direction and the horizontal direction of the solid-state imaging device 1 according to the first embodiment of the present disclosure. In addition, FIG. 3 is a cross section configuration drawing along the line III-III in FIG. 2. The solid-state imaging device 1 of the present embodiment includes a substrate 22, a wiring layer 23 that is formed on the front surface side of the substrate 22 and a support substrate 26. In addition, the solid-state imaging device 1 of the present embodiment includes an element isolation section 31, a planarizing film 32, a color filter layer 33 and a collecting lens 34. In addition, in the following description, the embodiment is described by setting a first conductivity type as a p-type and a second conductivity type as an n-type.

The substrate 22 is configured by a semiconductor substrate formed from silicon, and for example, is formed to have a thickness of 1 micrometers to 6 micrometers. A plurality of pixels, which are configured by a photoelectric conversion section 35 that is formed from a photodiode and a plurality of pixel transistors that configure a pixel circuit section, are formed in a two-dimensional matrix in the pixel region 3 of the substrate 22.

The photoelectric conversion section 35 is configured by first conductivity type (hereinafter referred to as p-type) semiconductor regions 36, 37 that are formed on the front surface side and the back surface side of the substrate 22 and a second conductivity type (hereinafter referred to as n-type) semiconductor region 38 that is formed between the first conductivity type semiconductor regions. In the photoelectric conversion section 35, the main photodiode is formed by the pn junctions between the p-type semiconductor regions 36, 37 and the n-type semiconductor region 38. A signal charge depending on the amount of light that is input is generated in the photoelectric conversion section 35 and the signal charge is stored in the n-type semiconductor region 38. In addition, since the p-type semiconductor regions 36, 37 are formed on the front surface and the back surface of the substrate 22 in the present embodiment, the occurrence of a dark current that is generated at the boundary of the substrate 22 is suppressed.

In addition, each photoelectric conversion section 35 is electrically isolated by a pixel isolation layer 39 that is configured by the p-type semiconductor regions and the element isolation section 31 that is formed inside the pixel isolation layer 39. The pixel isolation layer 39 is provided in the substrate 22 in a grid so as to define each photoelectric conversion section 35, and is formed from the back surface of the substrate 22 to a depth that reaches a p-well layer 43 (to be described later) that is formed by a source and drain region 40 of a pixel transistor Tr1.

The pixel transistor Tr1 is configured by a source and drain region 40 which is provided on the substrate 22 and a gate electrode 41 which is provided on the front surface side of the substrate 22 through a gate insulation film 42. As shown in FIG. 3, the source and drain region 40 is formed by an n-type semiconductor region which is formed by n-type impurities being injected into the p-well layer 43 formed on the front surface side of the substrate 22 at a high concentration.

A transfer transistor, an amplifier transistor, a reset transistor, a selection transistor or the like can be formed as the pixel transistor Tr1 that drives the pixels 2, but in FIG. 3, among the pixel transistors Tr1, only a transfer transistor is indicated as a representative example.

The element isolation section 31 is configured by a film (hereinafter referred to as a fixed charge film 28) that is embedded inside a groove section 27 that is formed in a depth direction from the back surface side of the substrate 22 and has a negative fixed charge, an embedded film 29 and a light shielding film 30. The element isolation section 31 is provided in a grid so as to define each pixel 2 and is provided so as to electrically isolate adjacent photoelectric conversion sections 35.

As shown in FIG. 3, the groove section 27 is formed in a depth direction from the back surface side of the substrate 22, and an uneven section 15 is provided on the side wall surface of the groove section 27. As shown in FIG. 2, the uneven section 15 is provided on opposing side wall surfaces of groove section 27 that are provided between pixels 2 (between photoelectric conversion sections 35) that are adjacent in the horizontal direction and the vertical direction. In addition, the side wall surface from the open end of the groove section 27 to the uneven section 15 and the side wall surface from the uneven section 15 to the bottom surface of the groove section 27 are formed in a tapered manner so that the width of the opening thereof becomes gradually smaller.

The uneven section 15 is provided so that the width of the opening of the groove section 27 becomes smaller in the depth direction of the substrate 22. In the present embodiment, the unevenness provided in the groove section 27 is configured with 1 step but a plurality of thereof may be provided.

In addition, the groove section 27 is formed to a depth that reaches a p-well layer 43 that is formed by a source and drain region 40 of the pixel transistor Tr1, and is formed to a depth that does not reach the source and drain region 40. In the present embodiment, the groove section 27 is formed to a depth that reaches the p-well layer 43 of the pixel transistor Tr1, but the end portion of substrate 22 on the back surface side of the element isolation section 31 may be formed so as to touch the a p-type semiconductor layer, and the therefore the groove section 27 does not have to be formed to a depth that reaches the p-well layer 43. In a case in which the groove section 27 is formed in a pixel isolation layer 39 that is formed from the p-type semiconductor layer as in the present embodiment, it is even possible to obtain an effect of insulation through isolation when the groove section 27 does not reach the p-well layer 43.

The fixed charge film 28 is formed across the entire surface of the back surface of the substrate 22 in addition to being formed on the side wall surface and the bottom surface of the groove section 27. Additionally, in the following description, the side wall surface and the bottom surface of the groove section 27 are referred to collectively as the "inner wall surface". It is preferable that the fixed charge film 28 use a material that is capable of enhancing pinning by generating a fixed charge as a result of being deposited on a silicon or similar substrate, and it is possible to use a film made from a material with a high refractive index that has a negative charge or a high dielectric film.

As examples of specific materials of the fixed charge film 28, for example, a hafnium oxide ($HfO_2$) film, an aluminum oxide ($Al_2O_3$) film, a zirconium oxide ($ZrO_2$) film, a tantalum oxide ($Ta_2O_5$) film or a titanium. oxide ($TiO_2$) film can be formed. The types of film indicated above have proven records of use in the gate insulation films of insulated gate field effect transistors and the like, and therefore it is possible to form films made from the materials easily since methods for forming films have been established. In addition, as examples of materials other than those indicated above, lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$) or the like may be used. Furthermore, it is possible to form the fixed charge film 28 that has a negative fixed charge from a hafnium nitride film, an aluminum nitride film, a hafnium oxynitride film or an aluminum oxynitride film.

Silicon (Si) or nitrogen (N) may be added to the material of the fixed charge film 28 that has a negative fixed charge within a range in which the material does not lose the insulation properties thereof. The concentration of the addition can be determined as appropriate within a range in which the insulation properties of the film will not be lost. In this manner, as a result of adding silicon (Si) or nitrogen (N), it is possible to increase the heat resistance and the element performance of ion injection during processing.

In addition, in order to enhance pinning to the silicon substrate or the like, an antireflective film may be laminated as a high-permittivity material after the negative fixed charge film 28 has been formed.

In the present embodiment, since the fixed charge film 28 that has a negative charge is formed on the inner wall surface of the groove section 27 and the back surface of the substrate 22, an inversion layer is formed on a surface that is in contact with the fixed charge film 28. As a result of this, since the silicon boundary is pinned by the inversion layer, it is possible to suppress the generation of a dark current. In addition, in a case in which the groove section 27 is formed on the substrate 22, physical damage is caused to the inner wall surface of the groove section 27, and there is a possibility that pinning release will be cause in the peripheral portions of the groove section 27. In contrast to this problem, in the present embodiment, it is possible to prevent pinning release by forming a fixed charge film 28 that has a large fixed charge on the inner wall surface of the groove section 27.

The embedded film 29 is formed so as to cover the entire surface of the back surface side of the substrate 22 in addition to being embedded in the groove section 27 in which the fixed charge film 28 is formed. Regarding the material of the embedded film 29, it is preferable that the embedded film 29 be formed from a material that has a refractive index that is different from that of the fixed charge film 28, and for example, it is possible to use silicon oxide, silicon nitride, silicon oxynitride or a resin. In addition, it is possible to use a specific material that does not have a positive fixed charge or has a small positive fixed charge in the embedded film 29.

Further, as a result of the embedded film 29 being embedded in the groove section 27, the photoelectric conversion sections 35 that configure each pixel are isolated through the embedded film 29. As a result of this, since it is unlikely that the signal charge will leak into neighboring pixels, it is possible to reduce the likelihood that an overflowing signal charge will leak into a neighboring photoelectric conversion section 35 in a case in which a signal charge that exceeds a charge saturation amount is generated. For this reason, it is possible to suppress electronic color mixing (the generation of blooming).

In addition, depending on the difference in the refractive indices thereof, the two-layered structure of the fixed charge film 28 that is formed on the back surface side that forms the input surface side of the substrate 22 and the embedded film 29 has a role of an antireflective film. As a result of this, it is possible to prevent reflection in the back surface side of the substrate 22 as a result of light input from the back surface side of the substrate 22.

The light shielding film 30 is formed in a position that is above the fixed charge film 28 and the embedded film 29 that are formed on the back surface side of the substrate 22 and directly above the groove section 27, and is disposed so as to shield light at the border regions between adjoining pixels 2 (between photoelectric conversion sections 35). In addition, the light shielding film 30 formed so that at least a portion thereof is embedded in the embedded film 29 that is embedded in the groove section 27, and in the present embodiment the depth of the embedding thereof is set to be above the open end of the groove section 27 that is provided on the substrate 22. As the material that forms the light shielding film 30, for example, a carbon black that absorbs light may be used in addition to metals such tungsten (W), aluminum (Al) and copper (Cu).

In the present embodiment, by setting the depth of the embedding of the light shielding film 30 to be above the open end of the groove section 27 that is provided on the substrate 22, it is possible to suppress deteriorations in image quality and the generation of a dark current that result from the influence of film stress. In addition, because the light shielding film 30 is formed so that at least a portion thereof is embedded in the embedded film 29 that is embedded in the groove section 27, it is possible to reduce optical color mixing as a result of diagonal input light.

The planarizing film 32 is formed over the entire surface of the embedded film. 29 that includes the light shielding film 30, and as a result of this, the surface of the back surface side of the substrate 22 is planarized. As the material of the planarizing film 32, for example, it is possible to use an organic material such as a resin.

The color filter layer 33 is formed on the upper surface of the planarizing film 32, and for example, is formed to correspond to R (red), G (green) and B (blue) for each pixel. In the color filter layer 33, light of a predetermined wavelength is transmitted, and the transmitted light is input into the photoelectric conversion section 35 of the substrate 22.

The collecting lens 34 is formed on the upper surface of the color filter layer 33. In the collecting lens 34, irradiated light is collected, and the collected light is efficiently input to the photoelectric conversion section 35 through the color filter layer 33.

The wiring layer 23 is formed on the front surface side of the substrate 22, and is configured to have wiring 25 that is laminated in a plurality of layers (three layers in the present embodiment) through an interlayer insulation film 24. The pixel transistor Tr1 that configures the pixels 2 is driven through the wiring 25 that is formed in the wiring layer 23.

The support substrate 26 is formed on the surface of the wiring layer 23 opposite the side that faces the substrate 22. The support substrate 26 is configured to strengthen the substrate 22 during production stages, and for example, is configured as a silicon substrate.

1-3 Method for Producing Solid-State Imaging Device

Next, a method for producing a solid-state imaging device of the present embodiment will be described. FIGS. 4A to 7H are process drawings that show a method for producing a solid-state imaging device according to the first embodiment of the present disclosure.

Figure 4A:
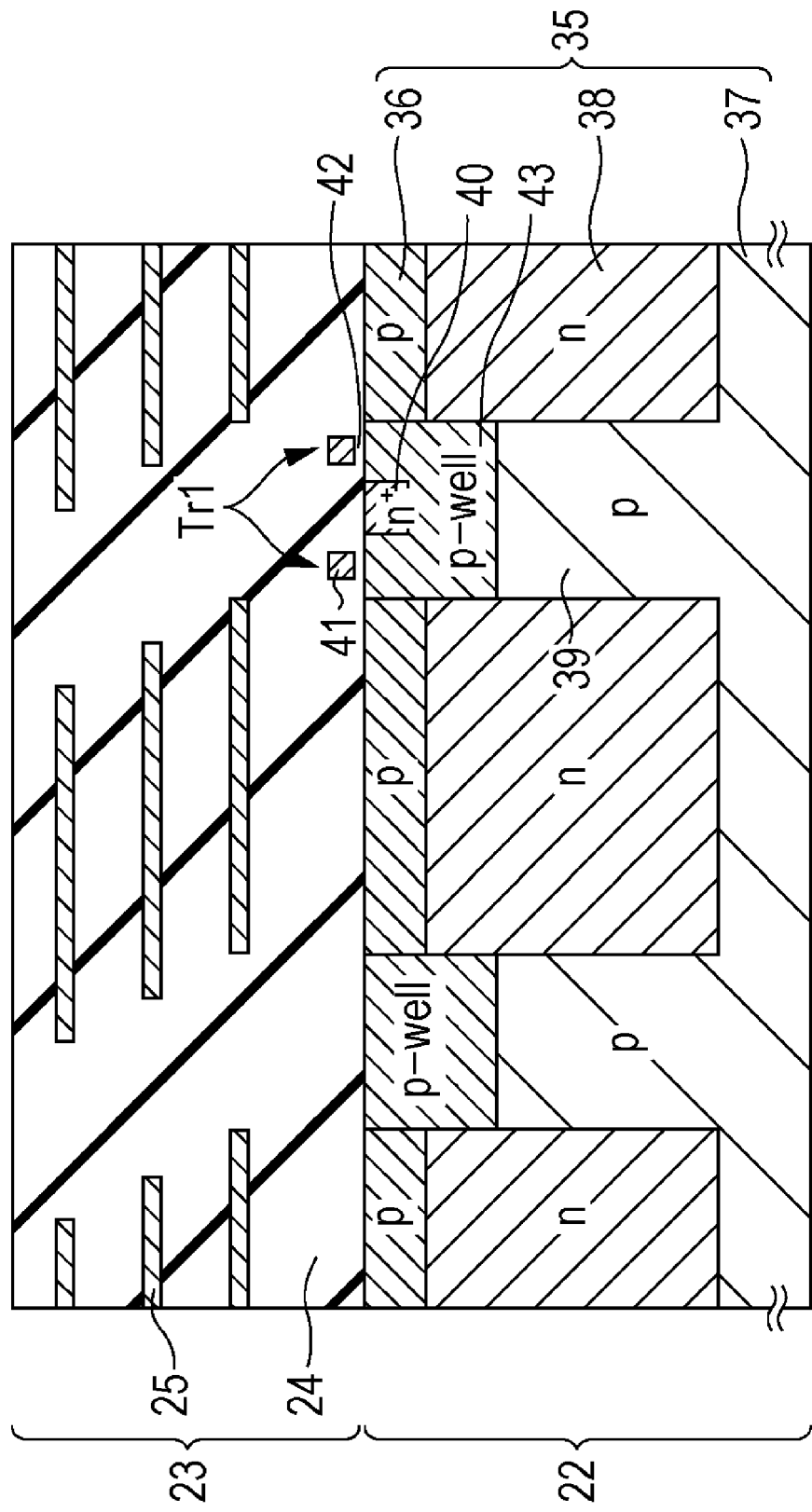
FIG. 4A is a process drawing (1 of 4) that shows a method for producing a solid-state imaging device according to the first embodiment of the present disclosure.

Firstly, as shown in FIG. 4A, after the photoelectric conversion section 35, the pixel transistor Tr1 and the pixel isolation layer 39 have been formed on the substrate 22, the wiring layer 23 is formed by alternately forming the interlayer insulation film 24 and the wiring 25 on the front surface of the substrate 22. The impurities of the photoelectric conversion section 35 and the like that are formed on the front surface of the substrate 22 are formed by injecting predetermined impurities from the front surface side of the substrate 22.

In the present embodiment, after forming the gate insulation film 42 that is formed from a silicon dioxide film for example, the gate electrode 41 that is formed from polysilicon for example, is formed on the front surface of the substrate 22 in a predetermined region above the gate insulation film 42.

In addition, although omitted from the drawing, during the formation of the wiring layer 23, contact via holes are formed according to necessity between wiring 25 that is vertically adjacent and between the wiring 25 and the pixel transistor Tr1. The contact via holes form contact holes in the interlayer insulation film 24, and are formed by embedding a predetermined metal material.

Figure 4B:
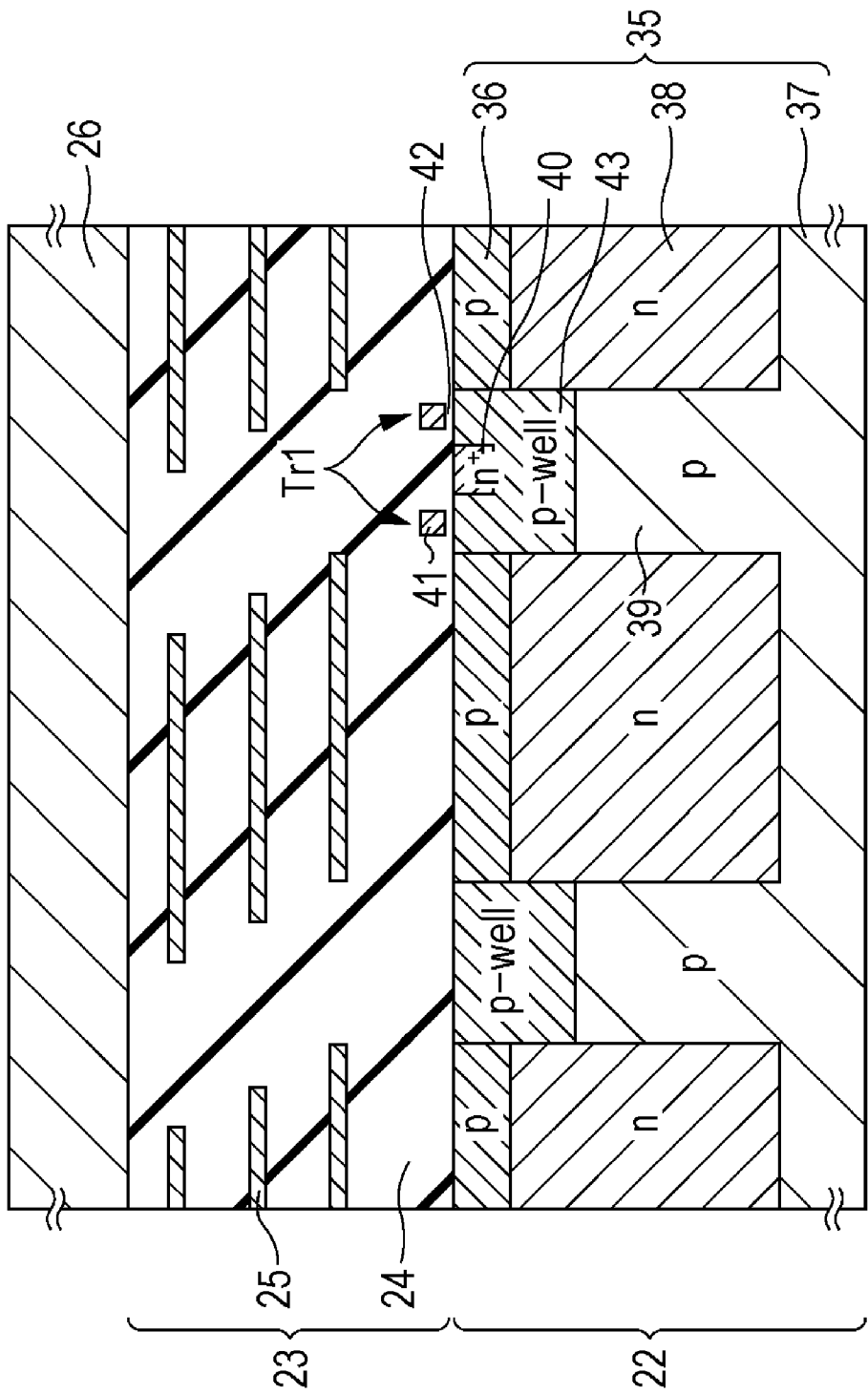
FIG. 4B is a process drawing (1 of 4) that shows a method for producing a solid-state imaging device according to the first embodiment of the present disclosure.

Next, as shown in FIG. 4B, the support substrate 26 that is formed from a silicon substrate is bonded to the uppermost layer of the wiring layer 23. Next, as shown in FIG. 5C, the substrate 22 is inverted, and the back surface side of the substrate 22 is thinned to a predetermined substrate 22 thickness using a chemical mechanical polishing (CMP) method, dry etching, wet etching or the like. Additionally, the method for polishing the substrate 22 may be any one of the abovementioned methods or may be a combination thereof.

Next, as shown in FIG. 5D, at the border of each pixel of the substrate 22, that is, a portion in which the pixel isolation layer 39 is formed, a groove section 27 of a predetermined depth is formed by selectively dry etching in the depth direction from the back surface side of the substrate 22.

The process that forms the groove section 27 forms a hard mask 65 that has a predetermined opening on the back surface side of the substrate 22, and forms the groove section 27 through processes of lithography and dry etching. In consideration of the spectral characteristics thereof, it is preferable that the depth of the groove section 27 be 0.2 micrometers or more from the back surface of the substrate 22, and it is more preferable that the depth be 1.0 micrometers or more. In addition, it is preferable that a width w1 of the opening of the groove section 27 be 0.02 micrometers. Processing of the groove section 27 is made easier by setting the width w1 of the opening of the groove section 27 to be wider, but since spectral characteristics and the charge saturation amount deteriorate in concert with increases in the width w1 of the opening of the groove section 27, it is more preferable that the width w1 of the opening of the groove section 27 be approximately 0.02 micrometers.

In such a case, it is desirable that a film that is used in the hard mask 65 be an $SiO_2$ film that can form a film at low temperature such as an HDP (High Density Plasma), a P-TEOS (Plasma Tetra Ethyl Oxysilane) or the like that can easily obtain selectivity for the substrate 22 at the time of dry etching for example. In addition to these, depending on the circumstances of apparatuses and the like, a P-SiN SiN film or the like or a resist mask may be used as the hard mask 65. For example, in a case of an $SiO_2$ film, it is preferable that the film thickness of the hard mask 65 be approximately 0.1 micrometers to 0.5 micrometers.

Next, as shown in FIG. 6E, a predetermined region above the hard mask 65 forms a photoresist 66, and the width of the opening of the hard mask 65 is widened by etching the hard mask 65 using the photoresist 66 as a mask. That is, a width w2 of the opening of the hard mask 65 that is formed in FIG. 6E is wider than the width w1 of the opening of the hard mask 65 used in FIG. 5D of the previous stage. Additionally, the width w2 of the opening of the hard mask 65 that is formed in FIG. 6E is set to be smaller than a width w3 of the pixel isolation layer 39 that is provided between adjacent photoelectric conversion sections 35. The method for removing a portion of the hard mask 65 that is used in this instance may be a high-temperature baking process.

Next, as shown in FIG. 6F, after the photoresist 66 has been removed, the substrate 22 is dry etched to a predetermined thickness through the hard mask 65 which has been expanded. At this time, etching removal is performed on the substrate 22 up to an extent at which the bottom surface of the groove section 27 that is formed on the substrate 22 reaches the p-well layer 43. In such a case, since the substrate 22 is etched using a hard mask 65 that has a wider opening than that used at the time of the etching in the process of FIG. 5D, an uneven section 15 is formed in the side wall surface of the groove section 27.

In the present embodiment the uneven section 15 that is provided in the side wall surface of the groove section 27 is configured with one step, in a case in which the forgoing is configured with a plurality of steps of two or more, it is possible to form a plurality of steps in the side wall surface of the groove section 27 by repeating the process of FIGS. 6E and 6F.

As described above, in the present embodiment, it is possible to form the uneven section 15 by processing the groove section 27 using a process with two steps. As a result of this, it is possible to form the light shielding film 30 that will be described later so that at least a portion thereof is embedded in the embedded film. Furthermore, by arbitrarily setting the depth of the groove section 27, it is possible to control the depth of the embedding of the light shielding film 30.

Next, the hard mask 65 that was used in the processing of the groove section 27 is removed, and as shown in FIG. 7G, the fixed charge film 28 is formed so as to cover the inner wall surface of the groove section 27 and the back surface of the substrate 22 using a CVD method, a sputtering method, an ALD method or the like. Thereafter, in addition to forming the embedded film 29 embedded in the groove section 27, the embedded film 29 is also formed on the upper surface of the fixed charge film 28 on the back surface side of the substrate 22.

In the present embodiment, the uneven section 15 is formed in the side wall surface of the groove section 27, and the width of the opening of the open end side of the groove section 27 is formed to be greater than the width of the opening of the bottom surface side of the groove section 27. As a result of this, in a case in which the embedded film 29 is formed in the groove section 27, embedding of the embedded film 29 in the bottom surface side of the groove section 27 is completed at an earlier stage than that in the open end side of the groove section. Therefore, it is possible to form a concave section 44 in the front surface of the embedded film 29 in a position that corresponds to the groove section 27 by adjusting the thickness of the film formation of the embedded film 29.

Figure 7H:
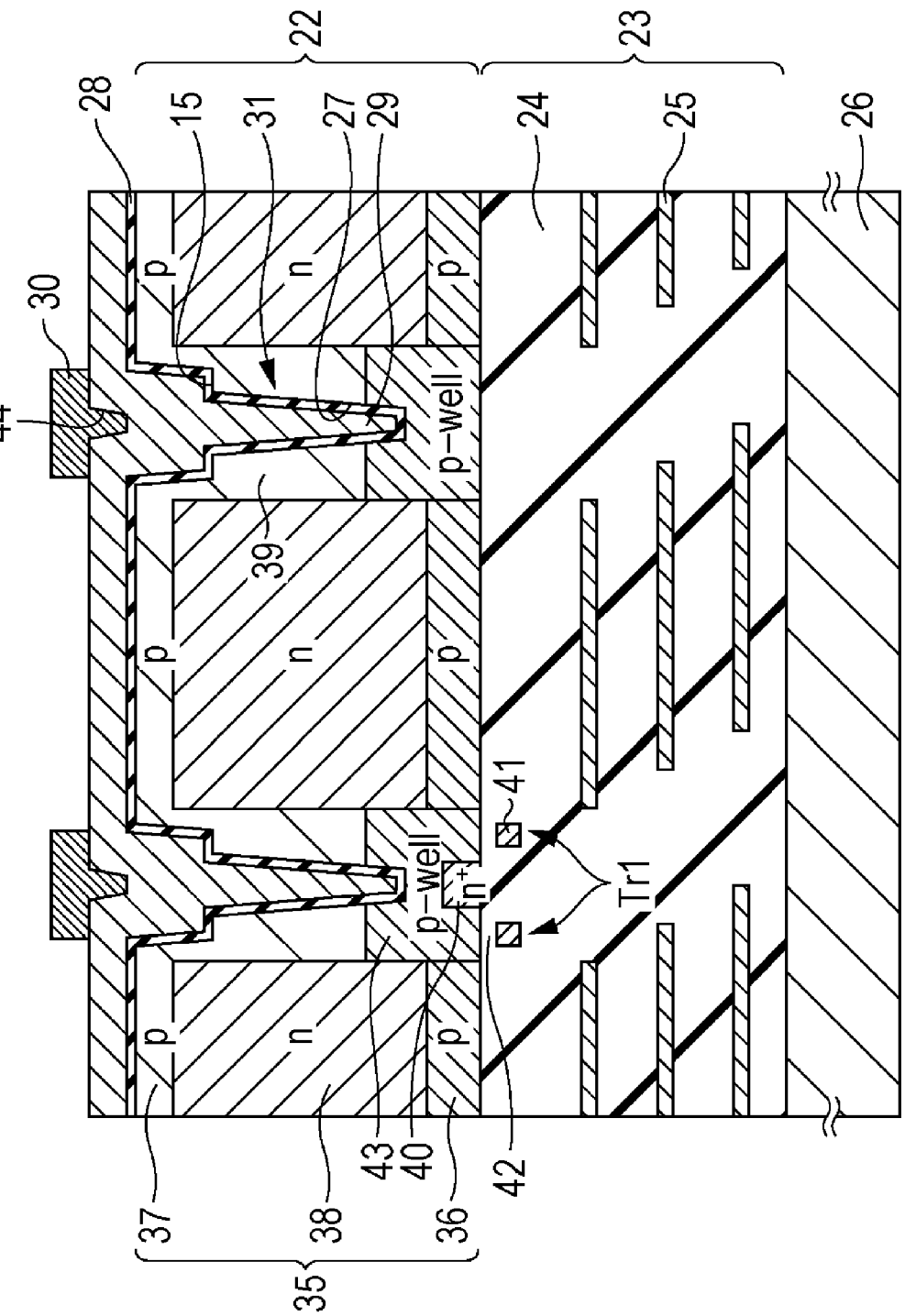
FIG. 7H is a process drawing (4 of 4) that shows a method for producing a solid-state imaging device according to the first embodiment of the present disclosure.

Next, as shown in FIG. 7H, the light shielding film 30 is formed across the entire upper surface of the embedded film 29, and the light shielding film 30 above the pixels is removed using lithography. As a result of this, as shown in FIG. 7H, a light shielding film 30 that is open over the photoelectric conversion section 35 and shield light between adjoining pixels is formed. In the present embodiment, the concave section 44 is formed on the front surface in a position that corresponds to the groove section 27 of the embedded film 29. For this reason, a portion of the light shielding film 30 that is provided above the groove section 27 is embedded in the concave section 44 of the embedded film 29. As a result of this, the element isolation section 31 that is configured by the fixed charge film 28, the embedded film 29 and the light shielding film 30 is formed between adjacent pixels 2.

Next, the solid-state imaging device 1 shown in FIG. 3 is completed by forming the planarizing film 32, the color filter layer 33 and the collecting lens 34 using common methods.

As a result of the abovementioned steps, a solid-state imaging device 1 with pixel isolation resulting from the element isolation section 31 that is formed by the embedded film 29 being embedded in the groove section 27 is formed.

In the solid-state imaging device 1 according to the present embodiment, the photoelectric conversion section 35 of each pixel is isolated by the element isolation section 31 that is formed by the embedded film 29 being embedded in the groove section 27. For this reason, it is possible to further reduce leaked signal charges stored in photoelectric conversion sections 35 to the sides of adjoining photoelectric conversion sections 35 than a case in which the photoelectric conversion sections 35 are isolated using an impurity region only. As a result of this, in a case in which a signal charge that is greater than or equal to the charge saturation amount is generated in the photoelectric conversion section 35, it is possible to flush the signal charge to the source and drain region 40 more effectively. As a result of this, it is possible to suppress electronic color mixing (the generation of blooming).

In addition, the abovementioned solid-state imaging device 1 has a light shielding film 30 that is disposed to shield light at the border regions between adjoining pixels 2 (between adjoining photoelectric conversion sections 35), and at least a portion of which is embedded in the embedded film 29. For this reason, the distance between the substrate 22 and the collecting lens 34 of each pixel is reduced, and it is possible to suppress degradations in focusing property. In addition, it is possible to reduce optical color mixing as a result of diagonal input light.

Furthermore, for example, in a case in which the depth of the embedding of the light shielding film 30 is set to be above the open end of the groove section 27 that is provided on the substrate 22, it is possible to suppress deteriorations in image quality and the generation of a dark current that result from film stress.

In such a case, the effects that the solid-state imaging device 1 of the present embodiment can achieve will be described by showing a comparative example.

1-4 Comparative Example

Figure 8:
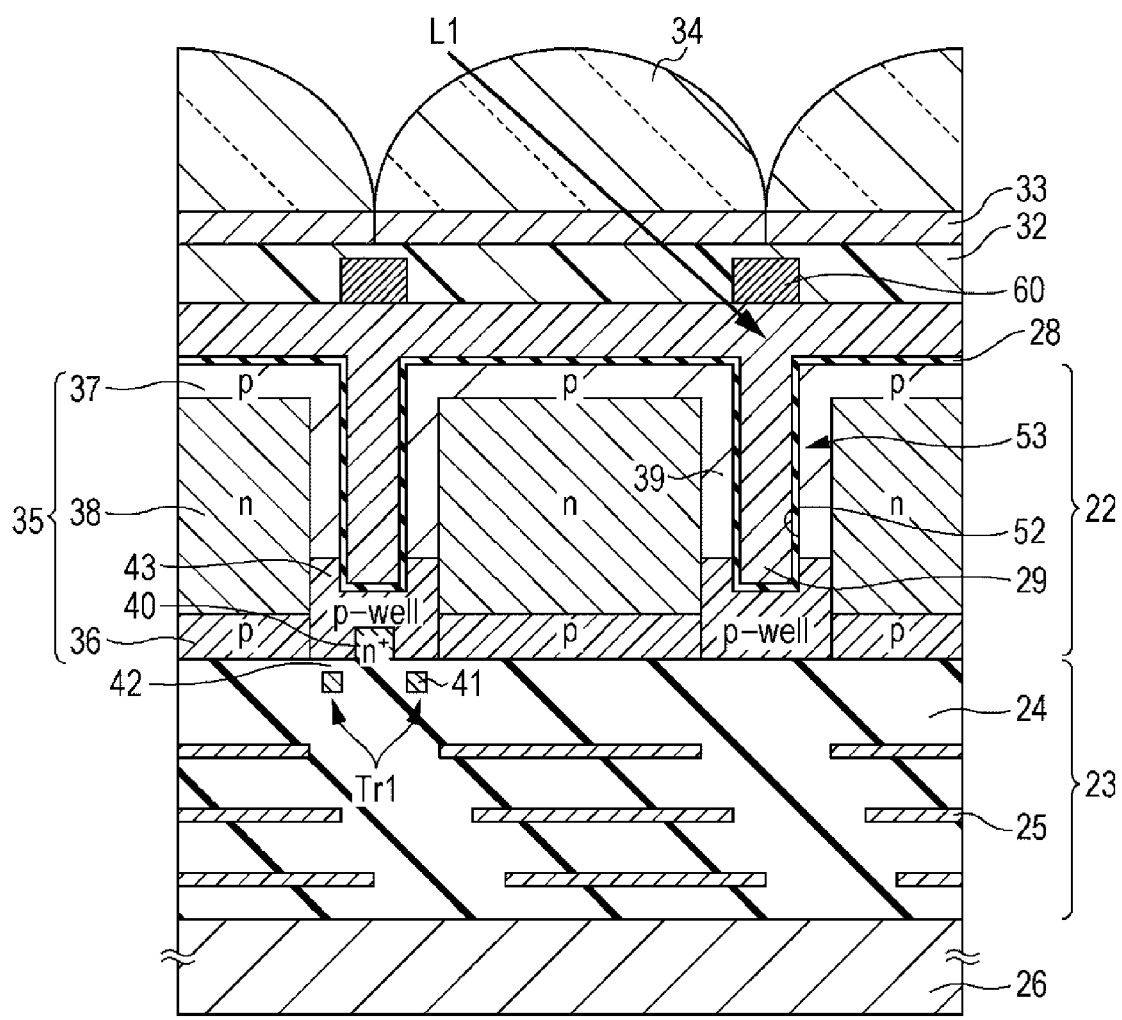
FIG. 8 is a cross section configuration drawing of the main portions of a solid-state imaging device according to a comparative example.

FIG. 8 is a cross section configuration drawing of the main portions of a solid-state imaging device according to a comparative example. In FIG. 8, portions that correspond to FIG. 3 are given the same reference symbols and duplicate description thereof has been omitted.

The solid-state imaging device 51 according to the comparative example is an example in which the configurations of a groove section 52 and an element isolation section 53 differ from those of the first embodiment. In the solid-state imaging device 51 of the comparative example, the groove section 52 has a configuration in which an uneven section 15 is not provided and the element isolation section 53 is configured by a fixed charge film 28 and an embedded film 29 that are formed one by one embedded in the groove section 52. In addition, a light shielding film 60 that is provided in the solid-state imaging device 51 according to the comparative example is formed so as to shield light at the border regions between adjoining pixels 2 (between adjoining photoelectric conversion sections 35), and is provided above the element isolation section 53. That is, in the solid-state imaging device 51 according to the comparative example, the light shielding film 60 is not embedded in the embedded film 29.

As shown in FIG. 8, in the solid-state imaging device 51 according to the comparative example, in a case in which the light shielding film 60 is formed between pixels 2 of the back surface side of the substrate 22, since the distance between the substrate 22 and the collecting lens 34 is longer than the height of the light shielding film 60, it is possible that degradations in focusing property may occur. In addition, in a configuration in which the light shielding film 60 is formed above the embedded film 29 that is embedded in the groove section 27, diagonal input light L1 from the embedded film 29 between open end of the groove section 27 provide on the back surface side of the substrate 22 and the light shielding film 60 leaks into other areas. For this reason, it is not possible to completely suppress optical color mixing as a result of the diagonal input light L1.

Meanwhile, in the solid-state imaging device 1 according to the first embodiment, as shown in FIG. 3, the light shielding film 30 is formed so that at least a portion thereof is embedded in the embedded film 29 that is embedded in the groove section 27. Therefore, it is possible to suppress degradations in focusing property by reducing the distance between the substrate 22 and the collecting lens 34 in comparison with the comparative example. In addition, in the solid-state imaging device 1 according to the present embodiment, it is possible to reduce optical color mixing as a result of the diagonal input light L1 by forming the light shielding film 30 so that at least a portion thereof is embedded in the embedded film 29 that is embedded in the groove section 27.

Incidentally, in the solid-state imaging device 1 according to the present embodiment, a configuration in which a portion of the light shielding film 30 embedded in the embedded film 29 is used, but in a case in which the metal material that configures the light shielding film 30 is inserted as far as the substrate 22, there are cases in which deteriorations in image quality and the generation of a dark current that result from film stress occur. In the solid-state imaging device 1 according to the present embodiment, as shown in FIG. 3, as a result of the groove section 27 that is formed on the back surface side of the substrate 22 being configured to have the uneven section 15, the width of the opening on the deep side of the groove section 27 is smaller than the width of the opening on the shallow side. For this reason, since the narrow side (the deep side of the groove section 27) of the width of the opening of the groove section 27 is reduced by the fixed charge film 28 and the embedded film 29 at the time of embedding the fixed charge film 28 and the embedded film 29 in the groove section 27, the light shielding film 30 that is formed thereafter is not formed in the deep side of the groove section 27. As a result of this, it is possible to reduce the depth at which the light shielding film 30 is embedded. Further, as a result of forming the light shielding film 30 at a depth at which the light shielding film 30 is not embedded in the substrate 22 as in the case of the present embodiment, it is possible to prevent the generation of a dark current that results from film stress.

In addition, in the solid-state imaging device 1 of the present embodiment, the groove section 27 is formed to a depth that reaches the p-well layer 43 that is formed by the pixel transistor Tr1. For this reason, since the element isolation section 31 electrically isolates adjacent photoelectric conversion sections 35, it is unlikely that signal charges will flow into adjacent pixels. Therefore, it is possible to reduce the likelihood that an overflowing signal charge will leak into a neighboring photoelectric conversion section 35 in a case in which a signal charge that exceeds a charge saturation amount is generated, and it is possible to suppress electronic color mixing (the generation of blooming).

1-5 Modification Example

Figure 9:
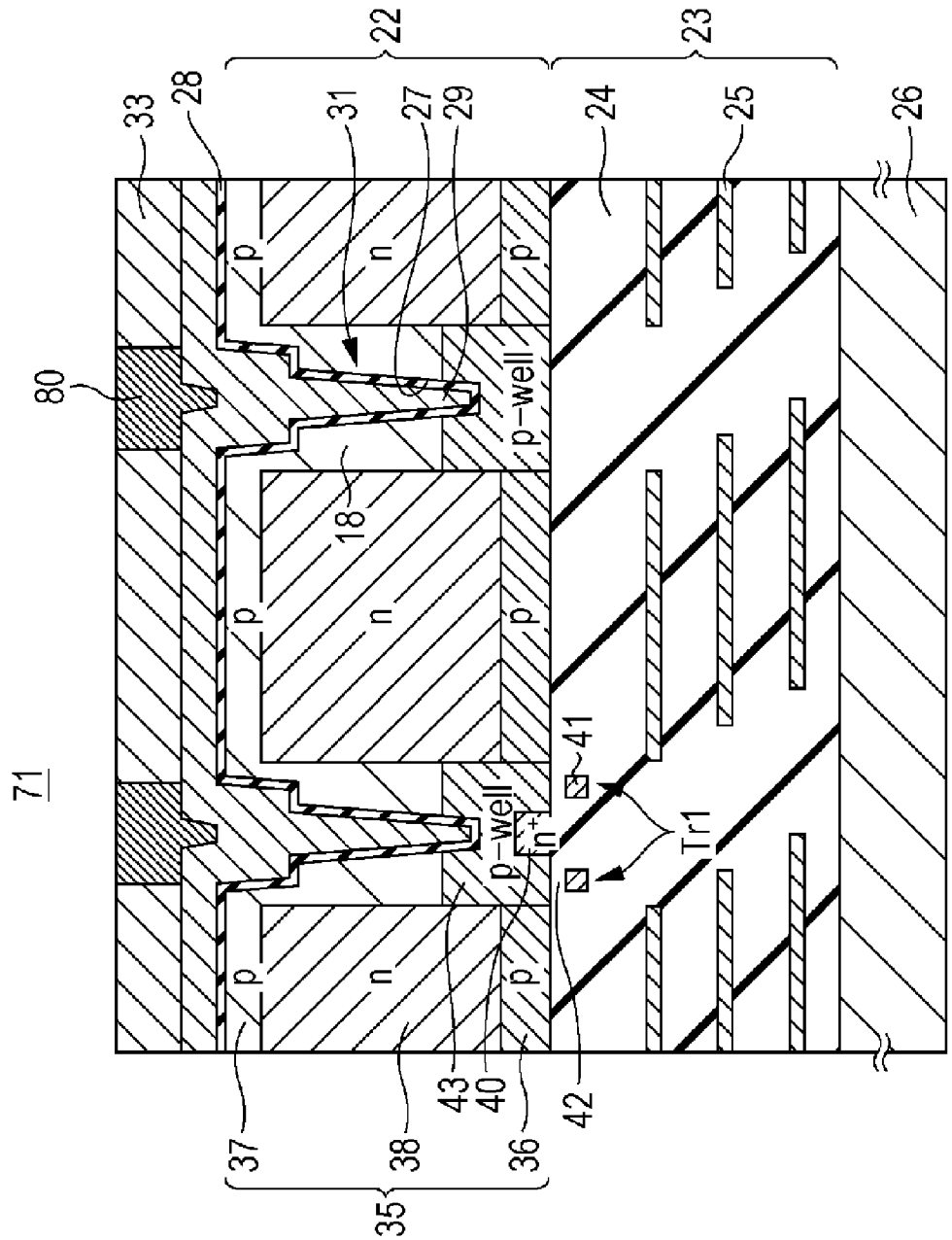
FIG. 9 is a cross section configuration drawing of the main portions of a solid-state imaging device according to a modification example.

Next an example in which the color filter layer 33 is isolated by a light shielding film 80 will be described as the solid-state imaging device 71 according to a modification example of the present embodiment. FIG. 9 is a cross section configuration drawing of the main portions of a solid-state imaging device according to a comparative example. In FIG. 9, portions that correspond to FIG. 3 are given the same reference symbols and duplicate description thereof has been omitted.

As shown in FIG. 9, in the solid-state imaging device 71 according to the modification example, the light shielding film 80 is provided above the fixed charge film 28 and the embedded film 29 that are embedded one by one in the groove section 27 that is formed on the back surface side of the substrate 22, and is formed in the same layer as the color filter layer 33. That is, the light shielding film 80 is disposed so as to shield light at the border regions of the color filter layer 33 between adjacent pixels 2. In addition, the light shielding film 80 is formed so that at least a portion thereof is embedded in the embedded film 29 that is embedded in the groove section 27. Furthermore, in the modification example of the present embodiment, the depth of the embedding of the light shielding film 80 is set to above the opening end of the groove section 27 provided in the substrate 22.

In addition, the color filter layer 33 is formed on the upper surface of the embedded film 29 and in the same layer as the light shielding film 80, and for example, is formed to correspond to R (red), G (green) and B (blue) for each pixel. In the color filter layer 33, light of a predetermined wavelength is transmitted, and the transmitted light is input into the photoelectric conversion section 35 of the substrate 22.

Since the photoelectric conversion sections 35 of each pixel are also isolated by the element isolation section 31 in the solid-state imaging device 71 that uses such a configuration, it is possible to suppress electronic color mixing (the generation of blooming).

In addition, in the solid-state imaging device 71 of the modification example, the light shielding film 80 is formed so that at least a portion thereof is embedded in the embedded film 29. As a result of this, the distance between the substrate 22 and the collecting lens 34 of each pixel is reduced, and it is possible to obtain the same effects as those of the present embodiment such as the ability to suppress degradations in focusing property and diagonal input light.

Furthermore, since it is possible to collect light by isolating the color filter layer 33 with the light shielding film 80 even if the collecting lens is not provided, pupil correction is not necessary, and an improvement in spectrum, light focusing and sensitivity can be achieved.

Figure 10A:
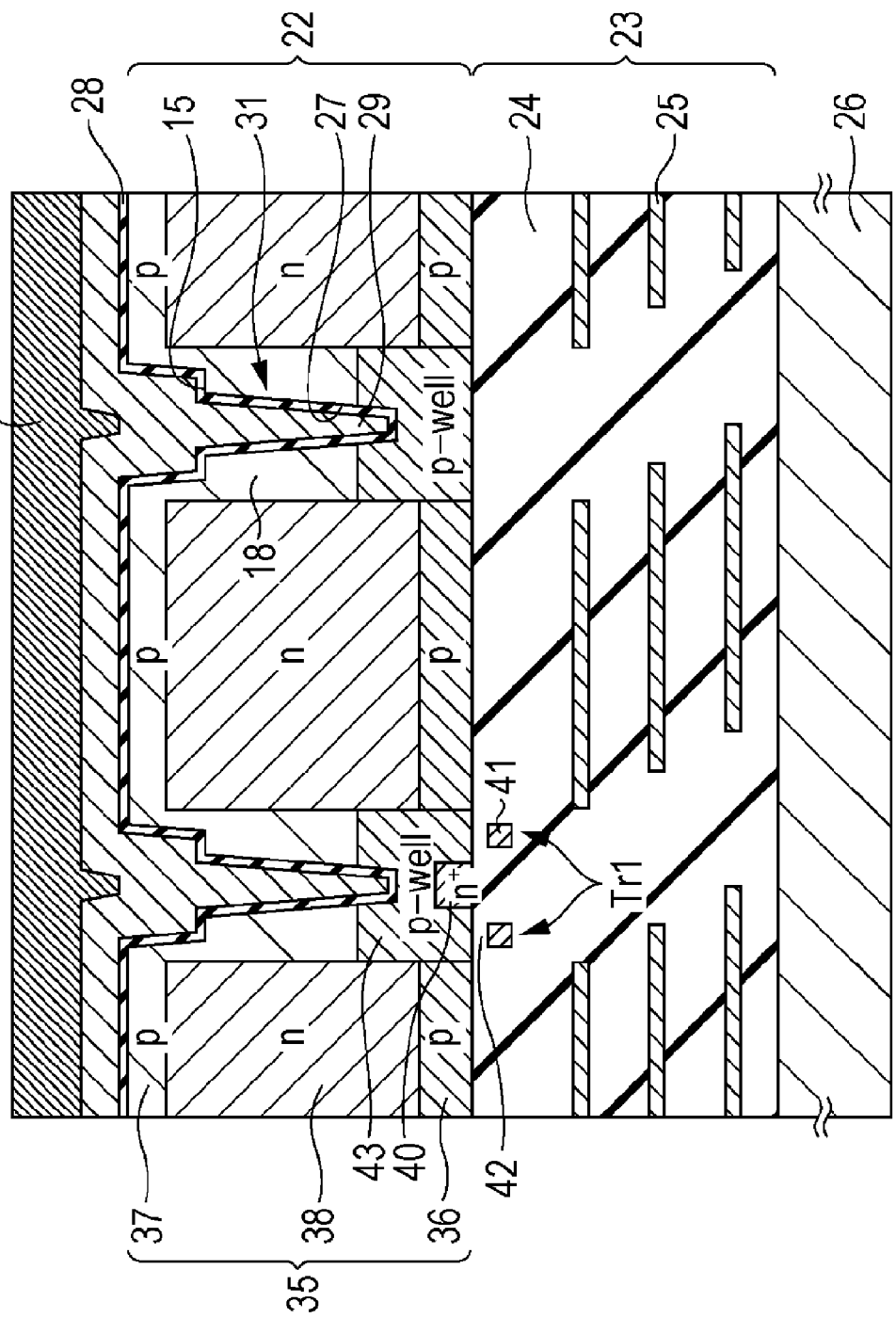
FIG. 10A is a process drawing that shows a method for producing a solid-state imaging device according to a modified example.

1-6 Method for Producing Solid-State Imaging Device According to a Modified Example Next, a method for producing a solid-state imaging device according to a modified example will be described. FIGS. 10A and 10B are process drawings that show a method for producing a solid-state imaging device according to a modified example. In FIGS. 10A and 10B, portions that correspond to FIGS. 4A to 7F are given the same reference symbols and duplicate description thereof has been omitted. In addition, in the modified example, since the processes up until the groove section 27 is formed are the same as the processes described using FIGS. 4A to 7F, the method is described for the processes that take place thereafter.

After the uneven section 15 has been formed so that the width of the opening becomes smaller in the depth direction of the substrate 22, as shown in FIG. 10A, the fixed charge film 28 is formed so as to cover the inner wall surface of the groove section 27 and the back surface of the substrate 22. This fixed charge film 28 is formed in the same manner as that in the first embodiment. Thereafter, using a CVD method, in addition to forming the embedded film 29 embedded in the groove section 27, the embedded film 29 is also formed on the upper surface of the fixed charge film 28 of the back surface side of the substrate 22. In addition, the thickness of the light shielding film 80 that is formed on the upper surface of the embedded film 29 is formed to be the same thickness as the color filter layer 33 that is formed by the following process.

Next, as shown in FIG. 10B, the light shielding film above the pixels is removed using photolithography. As a result of this, a light shielding film 80 that is open over the photoelectric conversion section 35 and that shields light between adjoining pixels 2 is formed.

Next, the solid-state imaging device 71 that is shown in FIG. 9 is completed by forming the color filter layer 33 using a common method.

As a result of the abovementioned steps, in the solid-state imaging device 71, since light is dispersed by the front surface of the color filter layer 33 for each pixel by isolating the color filter layer 33 with the light shielding film 80, it is possible to collect light even if the collecting lens is not provided. Since the photoelectric conversion sections 35 of each pixel are also isolated by the element isolation section 31 in the solid-state imaging device 71 that uses such a configuration, it is possible to suppress electronic color mixing (the generation of blooming). In addition, since it is possible to collect light even if the collecting lens is not provided, pupil correction is not necessary, and an improvement in spectrum, light focusing and sensitivity can be achieved.

In addition, in the solid-state imaging device 71 of the modification example, the light shielding film 80 is formed so that at least a portion thereof is embedded in the embedded film 29. As a result of this, the distance between the substrate 22 and the collecting lens 34 of each pixel is reduced, and it is possible to obtain the same effects as those of the present embodiment such as the ability to suppress degradations in focusing property and diagonal input light.

Figure 11A:
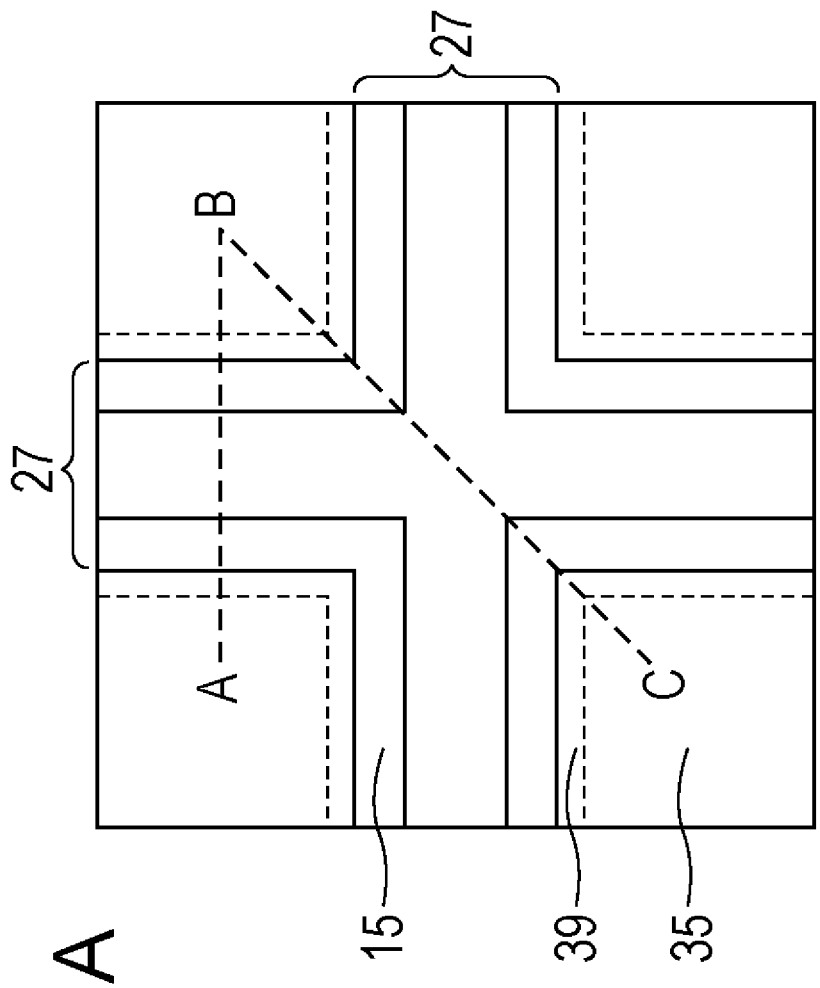
FIG. 11A is a planar layout of the central portion of a region that includes four pixels of the solid-state imaging device according to the first embodiment.
Figure 11B:
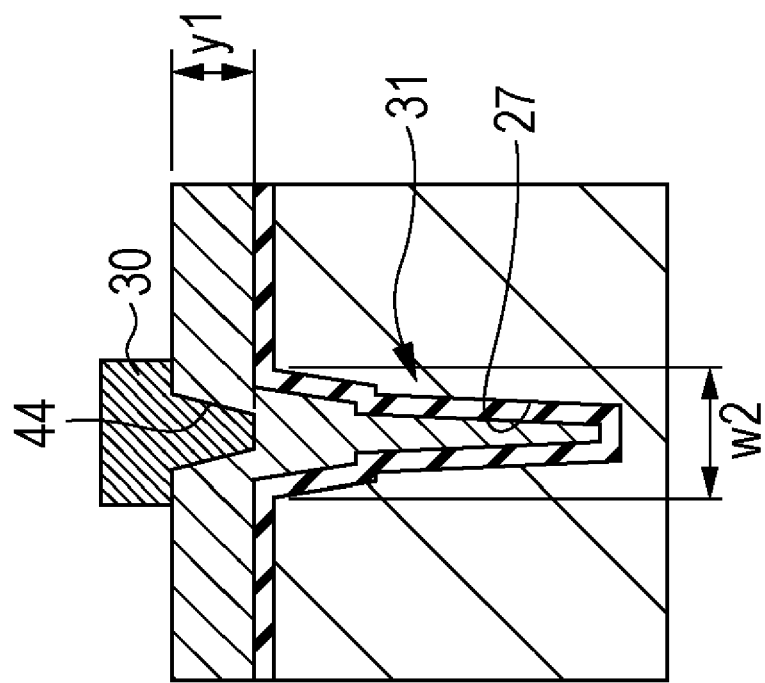
FIG. 11B is a cross section configuration drawing along the line A-B in FIG. 11A.
Figure 11C:
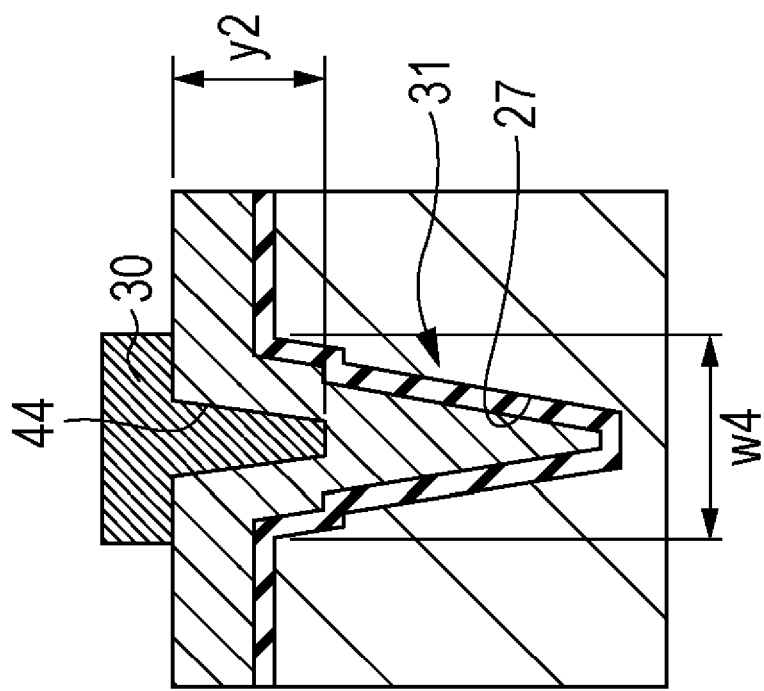
FIG. 11C is a cross section configuration drawing along the line B-C in FIG. 11A.

In this case, in FIG. 11A, a planar layout of the central portion of a region that includes four pixels of the solid-state imaging device according to the first embodiment is shown, in FIG. 11B, a cross section configuration drawing along the line A-B in FIG. 11A is shown and in FIG. 11C, a cross section configuration drawing along the line B-C in FIG. 11A is shown.

In the following description, the cross section along the line A-B that is indicated in FIG. 11A is set as a first cross section and the cross section along the line B-C is set as a second cross section. That is, the first cross section is a cross section that cuts the pixels 2 that are disposed in a two-dimensional matrix in the horizontal direction (or the vertical direction) and the second cross section is a cross section that cuts the pixels 2 in the diagonal direction.

In the element isolation section 31 of the solid-state imaging device 1 according to the first embodiment, the light shielding film 30 forms a shape that is embedded in the embedded film 29 by forming the groove section 27 that has an uneven section 15.

Incidentally, as shown in FIG. 11C, in the second cross section, the distance between pixels is larger than that of the first cross section that is shown in FIG. 11B. For this reason, in the second cross section, a width w4 of the opening of the groove section 27 is wider than the width w2 of the opening of groove section 27 in first cross section. That being the case, in a case in which the embedded film 29 is formed to conform to the inside of the groove section 27, the depth of the concave portion 44 that is formed on the front surface of the embedded film 29 is deeper in the second cross section than in the first cross section. As a result of this, the depth y2 of the embedding of the light shielding film 30 in the second cross section is deeper than the depth y1 of the embedding of the light shielding film 30 of the first cross section (y1<y2).

Considering this, in the following description, an example of a solid-state imaging device in which it is possible to make the depths of the embedding of the light shielding films 30 of the first cross section and the second cross section uniform will be described.

Figure 12C:
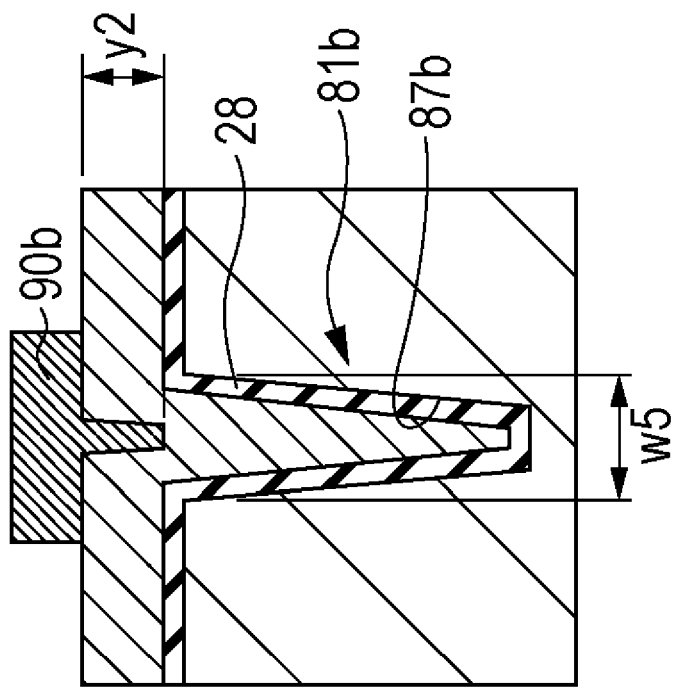
FIG. 12C is a cross section configuration drawing along the line B-C in FIG. 12A.

2. Second Embodiment: Solid-State Imaging Device 2-1 Configuration of Main Portions FIG. 12A is a planar layout of the central portion of a region that includes four pixels of the solid-state imaging device according to a second embodiment of the present disclosure. FIG. 12B is a cross section configuration drawing along the line A-B in FIG. 12A and FIG. 12C is a cross section configuration drawing along the line B-C in FIG. 12A.

In addition, FIG. 13 is a cross section configuration drawing along the line A-B-C in FIG. 12A. As shown in FIG. 13, a solid-state imaging device 91 of the present embodiment is an example in which the configurations of the groove section that is formed on the substrate 22 and the element isolation section that is formed in the groove section differ from those of the first embodiment. Therefore, in FIGS. 12A to 12C and FIG. 13, portions that correspond to FIG. 2 are given the same reference symbols and duplicate description thereof has been omitted. The solid-state imaging device 91 of the present embodiment is a backside-illuminated CMOS solid-state imaging device. Since the overall configuration of the solid-state imaging device 91 of the present embodiment is the same as that of FIG. 1, a drawing thereof has been omitted. In this case, the cross section along the line A-B that is indicated in FIG. 12A is set as a first cross section and the cross section along the line B-C is set as a second cross section.

In the solid-state imaging device 91 of the present embodiment, an element isolation section 81b in the second cross section is configured by a fixed charge film 28, an embedded film 29 and a light shielding film 90b that are formed one by one embedded in a groove section 87b that is formed in the depth direction from the back surface of the substrate 22. In addition, the groove section 87b in the second cross section is formed from the back surface of the substrate 22 in the depth direction, and since for example, the groove section 87b is made to be uniform with a width w5 of the opening of the groove section 87a in the first cross section, the configuration is one in which the uneven section 15 is not provided.

In the present embodiment, the groove section 87a in the first cross section is formed in the depth direction from the back surface side of the substrate 22 in the same manner as the groove section 27 in the solid-state imaging device according to a first embodiment, and is configured to have an uneven section 15 in the side wall surface thereof. In addition, the side wall surface from the open end of the groove section 87a to the uneven section 15 and the side wall surface from the uneven section 15 to the bottom surface of the groove section 87a are formed in a tapered manner so that the width of the opening thereof becomes gradually smaller.

Meanwhile, in the second cross section, the groove section 87b is formed in the depth direction from the back surface of the substrate 22, and has a configuration in which the uneven section 15 is not provided. In addition, the groove section 87b is formed so that the cross-sectional shape thereof is tapered.

In the solid-state imaging device 91 of the present embodiment, it is possible to make the widths w5 of the openings of the groove section 87a in the first cross section and the groove section 87b in the second cross section almost identical by only providing the uneven section 15 in the groove section 87a in the first cross section that is formed on the back surface side of the substrate 22. As a result of this, it is possible to make the depth y1 of the embedding of the light shielding film 90a in the element isolation section 81a in the first cross section and the depth y2 of the embedding of the light shielding film 90b of the element isolation section 81b in the second cross section uniform. As a result of the above, it is possible to make the element isolation section 81a in the first cross section and the element isolation section 81b in the second cross section uniform, and in addition, the spectrum design is simple since it is possible to make the light shielding performance with respect to light shielding uniform.

Furthermore, for example, in a case in which the light shielding films 90a and 90b are formed above the open ends of the groove section 87a and the groove section 87b that are provided in the substrate 22, it is possible to suppress deteriorations in image quality and the generation of a dark current that result from film stress.

In addition to the above, it is possible to obtain the same effects as those of the first embodiment.

2-2 Method for Producing Solid-State Imaging Device

Next, a method for producing the solid-state imaging device 91 of the present embodiment will be described. FIGS. 14A to 15D are process drawings that show a method for producing a solid-state imaging device according to the second embodiment of the present disclosure. Additionally, FIGS. 14A to 15D are cross section configuration drawings along the line A-B-C of the planar layout in FIG. 11A, the left side in the drawings is set as the cross section (first cross section) between A-B, and the right side is set as the cross section (second cross section) between B-C. Portions that correspond to FIGS. 4A to 5C are given the same reference symbols and duplicate description thereof has been omitted. In addition, in the present embodiment, since the processes up until the groove section is formed are the same as the processes described using FIGS. 4A to 5C, the method is described from the processes that take place thereafter.

The processes shown in FIG. 14A are equivalent to those in FIG. 5D. In this case, as shown in FIG. 12A, second cross section is a region in which a groove section that extends in the horizontal direction of the pixel and a groove section that extends in the vertical direction of the pixel intersect. Therefore, the width w5 of the opening of the groove section 87b that is formed in the second cross section is formed to be wider than the width w1 of the opening of groove section 87a that is formed in the first cross section.

Figure 14B:
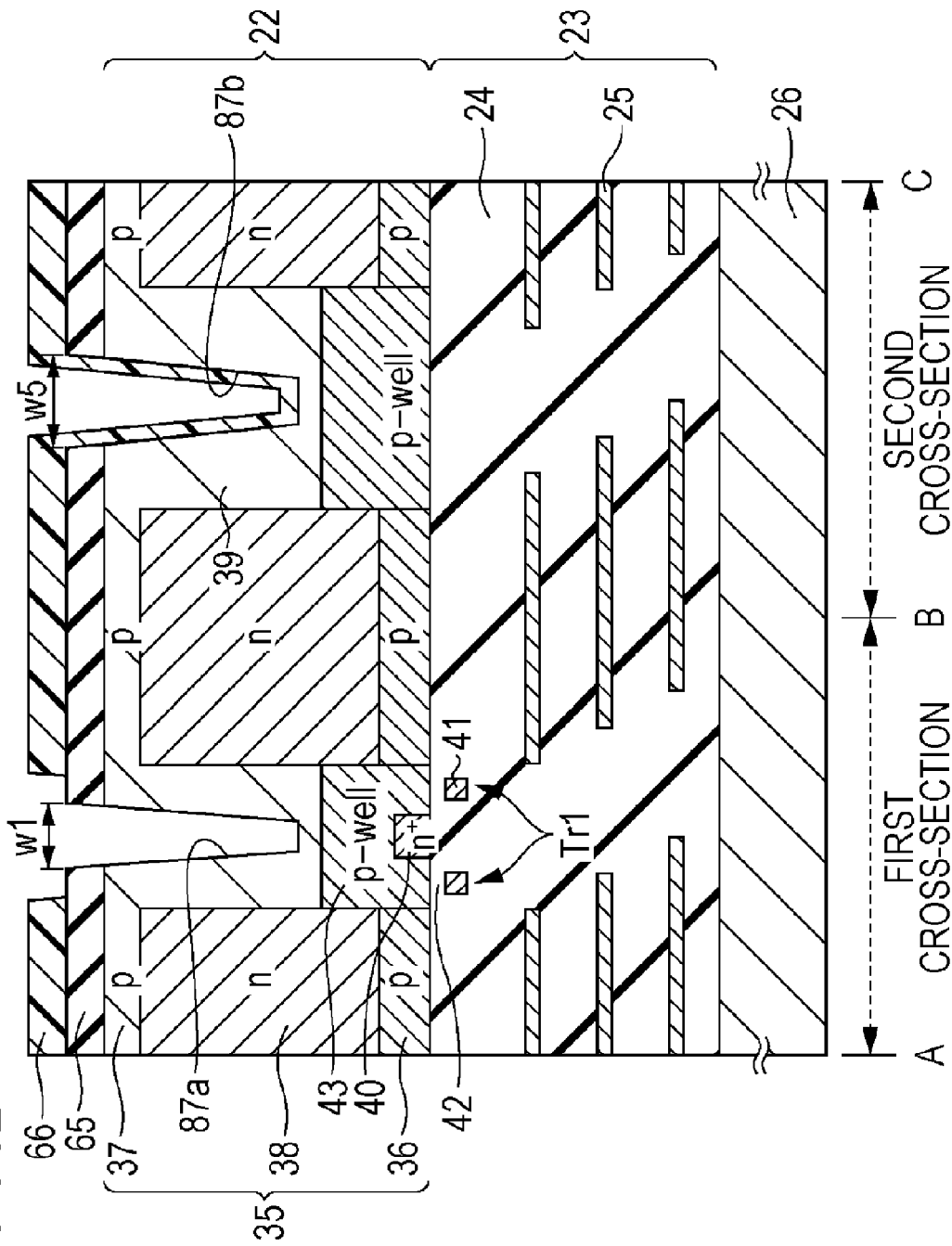
FIG. 14B is a process drawing (1 of 2) that shows a method for producing a solid-state imaging device according to the second embodiment of the present disclosure.

Next, as shown in FIG. 14B, using photolithography, a photoresist 66 is formed to have an opening that exposes the hard mask 65 that is provided in the periphery of the open end of the groove section 87a in the first cross section. At this time, the width w5 of the opening of the photoresist 66 is set to the same extent as the width w5 of the opening of the groove section 87b in the second cross section that is formed in FIG. 14A. Further, an opening of the width w5 is formed in the hard mask 65 in the second cross section by etching the hard mask 65 through the photoresist 66. Additionally, at this time, in the groove section 87b, the photoresist 66 is formed over the entire surface of the groove.

Figure 15C:
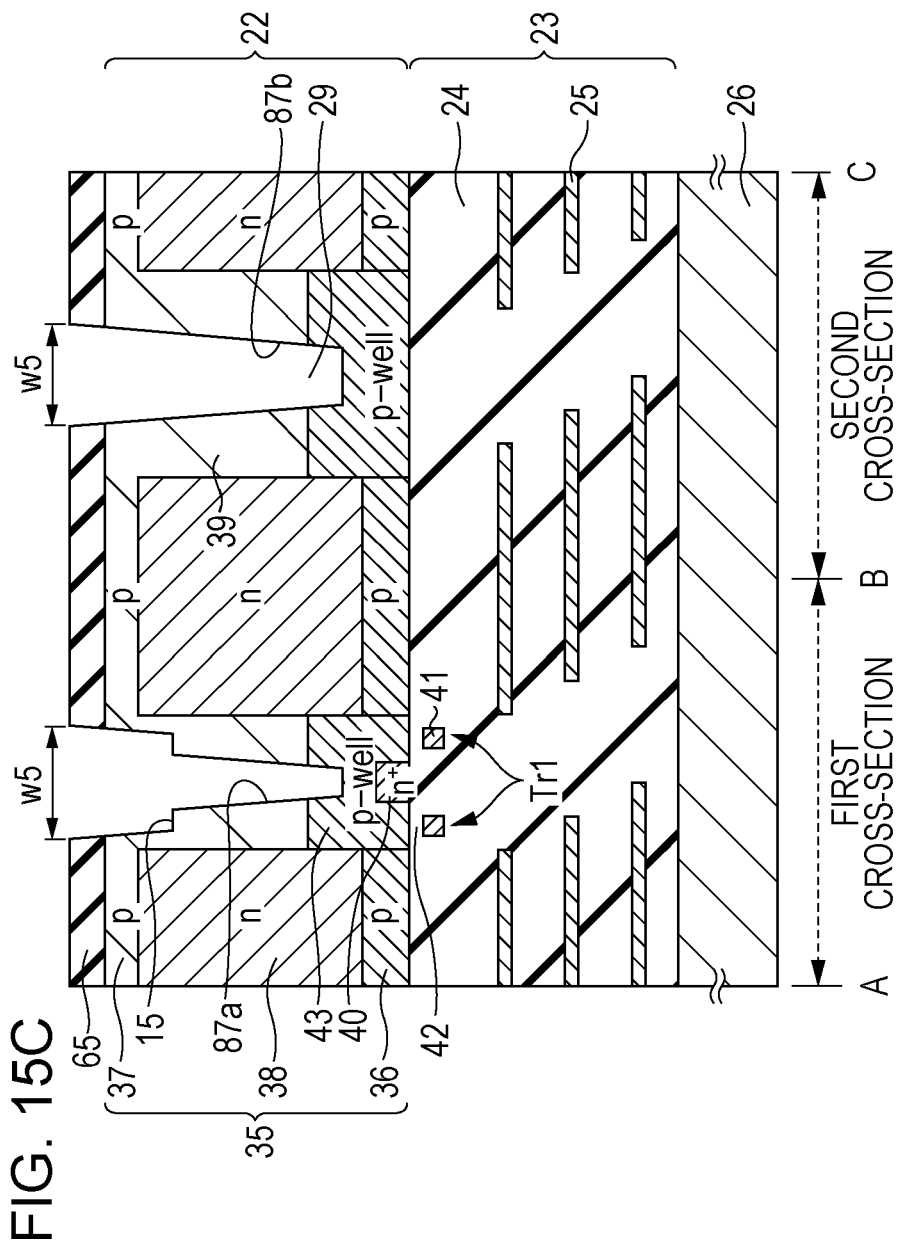
FIG. 15C is a process drawing (2 of 2) that shows a method for producing a solid-state imaging device according to the second embodiment of the present disclosure.

Next, as shown in FIG. 15C, the photoresist 66 is removed, and in the second cross section, the substrate 22 is etched to a predetermined depth through the hard mask 65 of which a portion has been removed. As a result of this, the uneven section 15 is formed on the side wall surface of the groove section 87a in the first cross section only. In this case, the width w5 of the opening of the open end side of the groove section 87a in the first cross section becomes the same extent as the width w5 of the opening of the open end side of the groove section 87b in the second cross section.

Figure 15D:
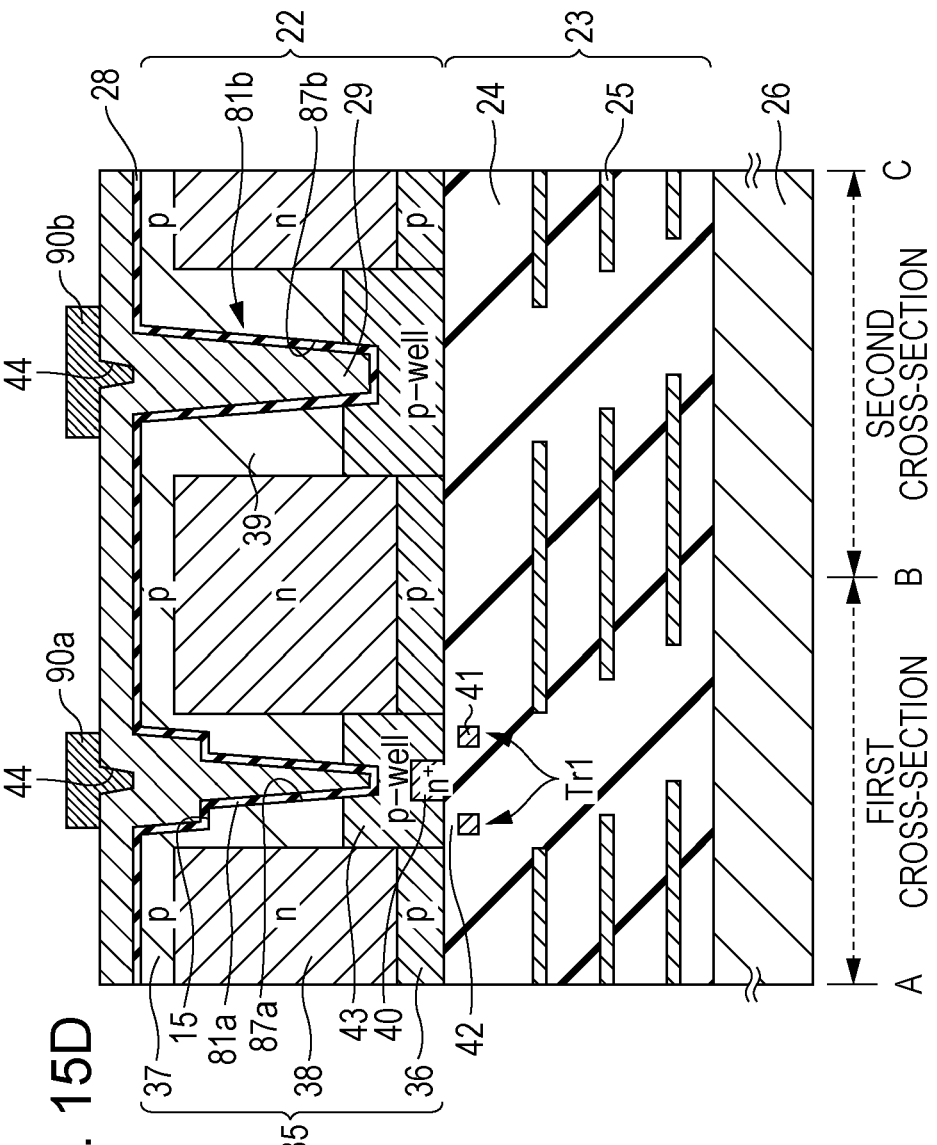
FIG. 15D is a process drawing (2 of 2) that shows a method for producing a solid-state imaging device according to the second embodiment of the present disclosure.

Next, the hard mask 65 that was used in the processing of the groove sections 87a, 87b is removed, and as shown in FIG. 15D, the fixed charge film 28 is formed so as to cover the inner wall surface of the groove sections 87a, 87b and the back surface of the substrate 22. This fixed charge film 28 is formed in the same manner as that of the first embodiment. Thereafter, using a CVD method, in addition to forming the embedded film 29 embedded in the groove sections 87a, 87b, the embedded film 29 is also formed on the upper surface of the fixed charge film 28 on the back surface side of the substrate 22.

At this time, the embedded film 29 is formed to substantially conform to the insides of the groove sections 87a, 87b. In the present embodiment, the widths of the openings of the groove sections 87a, 87b are the same. In addition, in the present embodiment, in the open end side of the groove section 87a of the first cross section and the open end side of the groove section 87b of the second cross section, the amount of the embedding of the embedded film 29 is adjusted to the film thickness that the concave portion 44 above the groove sections 87a, 87b is formed. In this case, the depth of the concave portion 44 that is formed above the groove section 87a and the depth of the concave portion 44 that is formed above the groove section 87b are substantially the same.

Next, a light shielding material layer is formed across the entire upper surface of the embedded film 29, and the light shielding material layer above the pixels 2 is removed using lithography. As a result of this, as shown in FIG. 15D, light shielding films 90a and 90b that are open over the photoelectric conversion section 35 and that shield light between adjoining pixels 2 are formed.

Next, the solid-state imaging device 91 shown in FIG. 13 is completed by forming the planarizing film 32, the color filter layer 33 and the collecting lens 34 using common methods.

In the present embodiment, a solid-state imaging device 91, in which the uneven section 15 is provided in the groove section 87a in the first cross section only, and the respective widths w5 of the openings of the groove sections 87a, 87b in the first cross section and the second cross section are substantially the same, is formed. Further, as a result of this, the amount of the embedding of the embedded film is substantially the same in the groove sections 87a, 87b.

Therefore, it is possible to make the depth y1 that the light shielding film 90a is embedded in the embedded film 29 of the groove section 87a and the depth y2 that the light shielding film 90b is embedded in the embedded film 29 of the groove section 87b uniform. As a result of the above, it is possible to make the element isolation section 81a in the first cross section and the element isolation section 81b in the second cross section uniform, and in addition, the spectrum design is simple since it is possible to make the light shielding performance with respect to light shielding uniform.

Furthermore, for example, in a case in which the light shielding films 90a and 90b are formed above the opening end of the groove section 87a and 87b provided on the substrate 22, it is possible to suppress deteriorations in image quality and the generation of a dark current that result from film stress.

In addition to the above, it is possible to obtain the same effects as those of the first embodiment.

In the present embodiment, the light shielding films 90a and 90b are formed above the opening ends of the groove sections 87a and 87b that are provided on the substrate 22, but the foregoing may be formed embedded below the opening ends. In this case, it is possible to achieve a reduction in film stress by adjusting the light shielding films so that the foregoing are not embedded below the opening ends of the groove section 87a and 87b that are provided on the substrate 22.

Additionally, it is possible to apply the structures of the element isolation sections 81a and 81b in the solid-state imaging device 91 of the present embodiment to the dicing processing of a semiconductor wafer. Hereinafter, an example thereof will be described.

Figure 16A:
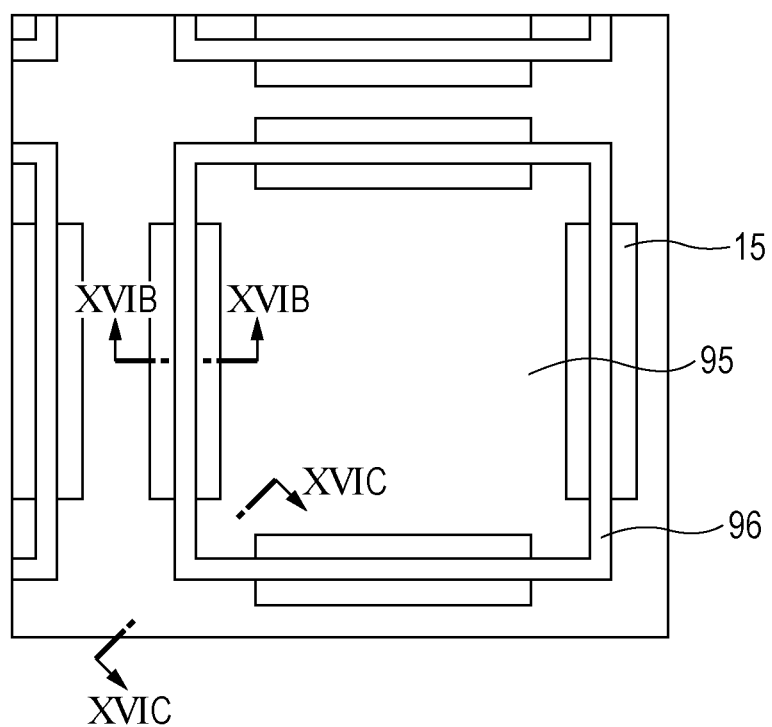
FIG. 16A is a planar layout of a semiconductor chip.
Figure 16B:
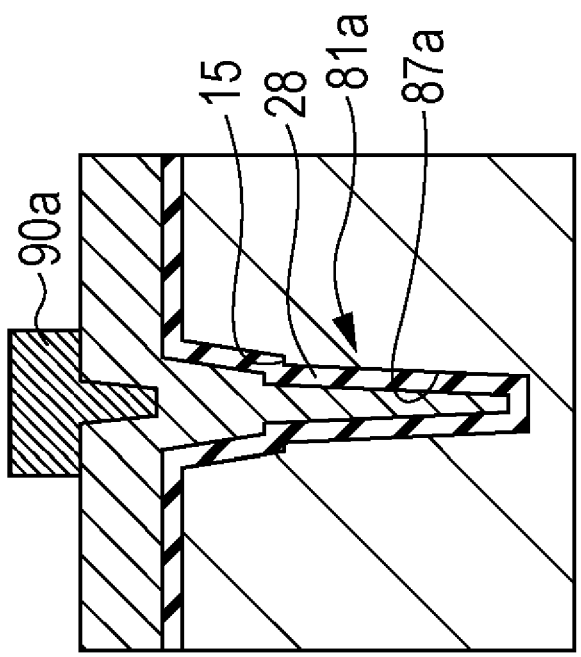
FIG. 16B is a cross section configuration drawing along the line XVIB-XVIB of the guard ring provided in the semiconductor chip.
Figure 16C:
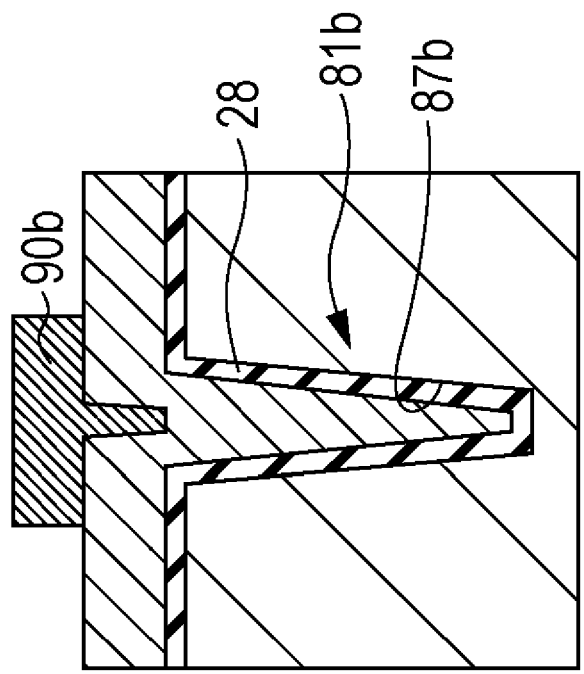
FIG. 16C is a cross section configuration drawing along the line XVIC-XVIC of the guard ring.

FIG. 16A is a planar layout of a semiconductor chip. FIG. 16B is a cross section configuration drawing along the line XVIB-XVIB of the guard ring provided in the semiconductor chip. FIG. 16C is a cross section configuration drawing along the line XVIC-XVIC of the guard ring. In FIGS. 16A to 16C, portions that correspond to FIGS. 12B and 12C are given the same reference symbols and duplicate description thereof has been omitted.

As shown in FIG. 16A, the structure of the element isolation sections 81a and 81b in the solid-state imaging device 91 of the present embodiment is provided in a portion of a guard ring 96 of a semiconductor chip 95. A cross section along the line XVIB-XVIB of FIG. 16A cuts the guard ring in the horizontal direction (or the vertical direction) and a cross section along the line XVIC-XVIC cuts the guard ring in the diagonal direction. In this case also, the cross section along the line XVIB-XVIB that is indicated in FIG. 16A is set as a first cross section and the cross section along the line XVIC-XVIC is set as a second cross section. An element isolation section 81a that is used in the present embodiment is provided in the first cross section (between XVIB-XVIB), and an element isolation section 81b that is used in the present embodiment is provided in the second cross section (between B-B). As a result of this, it is possible to obtain a crack prevention effect.

Figure 18:
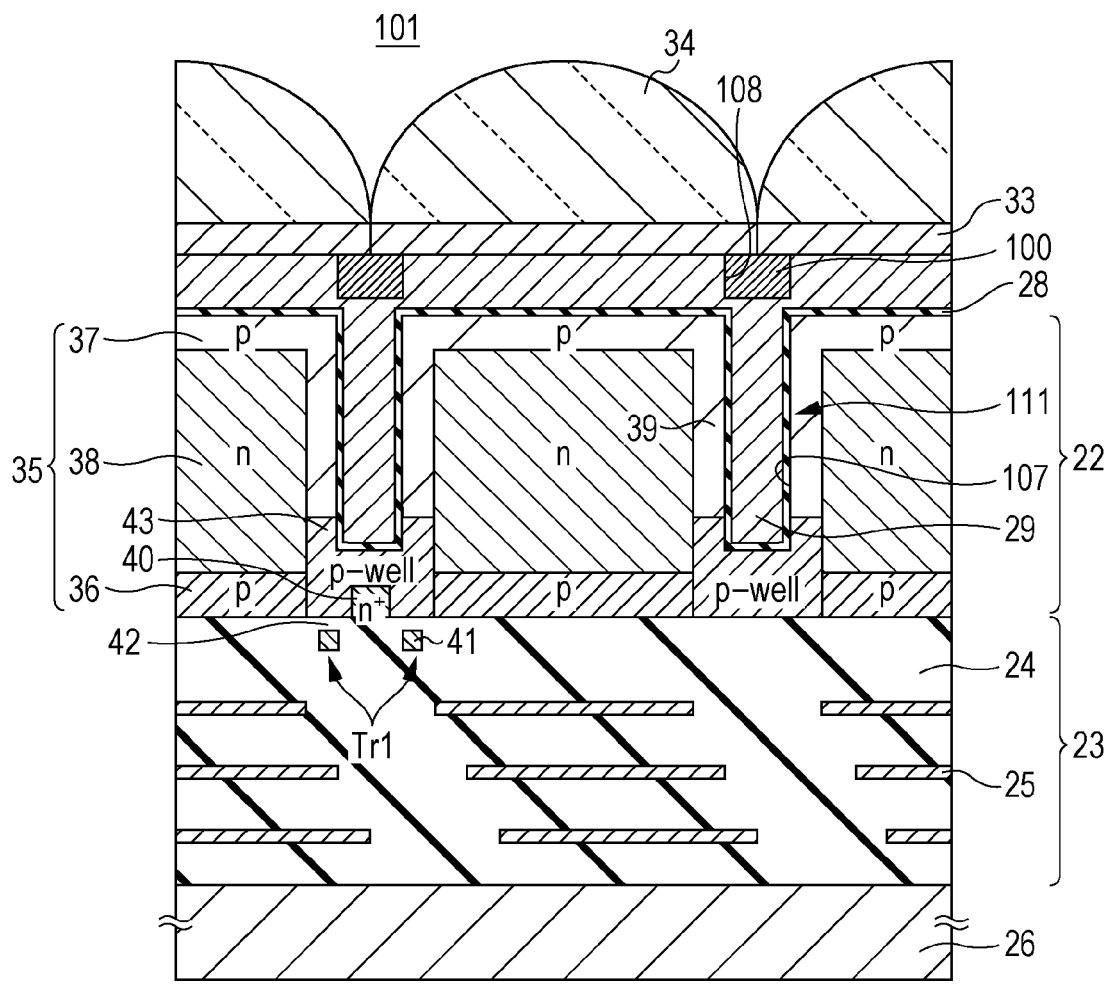
FIG. 18 is a cross section configuration drawing along the line XVIII-XVIII in FIG. 17A.

3. Third Embodiment: Solid-State Imaging Device 3-1 Configuration of Main Portions Next, a solid-state imaging device according to a third example of the present disclosure will be described. Since the overall configuration of the solid-state imaging device of the present embodiment is the same as that of FIG. 1, a drawing thereof has been omitted. FIG. 17 is a planar layout of the central portion of a region that includes four pixels of the solid-state imaging device according to a third embodiment of the present disclosure. FIG. 18 is a cross section configuration drawing along the line XVIII-XVIII in FIG. 17. In FIG. 18, portions that correspond to FIG. 3 are given the same reference symbols and duplicate description thereof has been omitted. A solid-state imaging device 101 of the present embodiment is a backside-illuminated CMOS solid-state imaging device. Since the overall configuration of the solid-state imaging device 101 of the present embodiment is the same as that of FIG. 1, a drawing thereof has been omitted.

The solid-state imaging device 101 of the present embodiment is an example in which the configurations of a groove section 107 and an element isolation section 111 differ from those of the solid-state imaging device 1 according to the first embodiment.

As shown in FIG. 18, in the solid-state imaging device 101 of the present embodiment, the groove section 107 is formed from the back surface of the substrate 22 in the depth direction. In addition, the element isolation section 111 is configured by a fixed charge film 28 and an embedded film 29 that are formed one by one embedded in the groove section 107 that is formed from the back surface of the substrate 22 in the depth direction. In the solid-state imaging device 101 according to the present embodiment, a light shielding film 100 provided above the open end of the groove section 107 that is provided on the substrate 22, and is formed embedded in the embedded film 29.

Therefore, in the solid-state imaging device 101 of the present embodiment, the light shielding film 100 is formed above the open end of the groove section 107 provided on the substrate 22, and embedded in the embedded film 29. As a result of this, it is possible to obtain the same effects as those of the first embodiment such as the ability to reduce optical color mixing as a result of diagonal input light.

3-2 Method for Producing Solid-State Imaging Device

Next, a method for producing the solid-state imaging device 101 of the present embodiment will be described. FIGS. 19A to 20D are process drawings that show a method for producing a solid-state imaging device according to the third embodiment of the present disclosure. Additionally, FIGS. 19A to 20D are cross sections along the lines XIX-XIX and XX-XX of the planar layout in FIG. 17. In FIGS. 19A to 20D, portions that correspond to FIGS. 4A to 5C are given the same reference symbols and duplicate description thereof has been omitted. In the present embodiment, since the processes up until the groove section is formed are the same as the processes described using FIGS. 4A to 5C, the method is described from the processes that take place thereafter.

After the substrate 22 has been thinned, as shown in FIG. 19A, a groove section 107 of a predetermined depth is formed at the border of each pixel of the substrate 22, that is, in a portion in which the pixel isolation layer 39 is formed by selectively etching from the back surface of the substrate 22 in the depth direction.

The process that forms the groove section 107 forms a hard mask 65 that has a predetermined opening on the back surface side of the substrate 22, and forms the groove section 107 by dry etching through the hard mask 65. In consideration of the spectral characteristics thereof, the depth of the groove section 107 is formed in the same manner as that of the first embodiment.

Figure 19B:
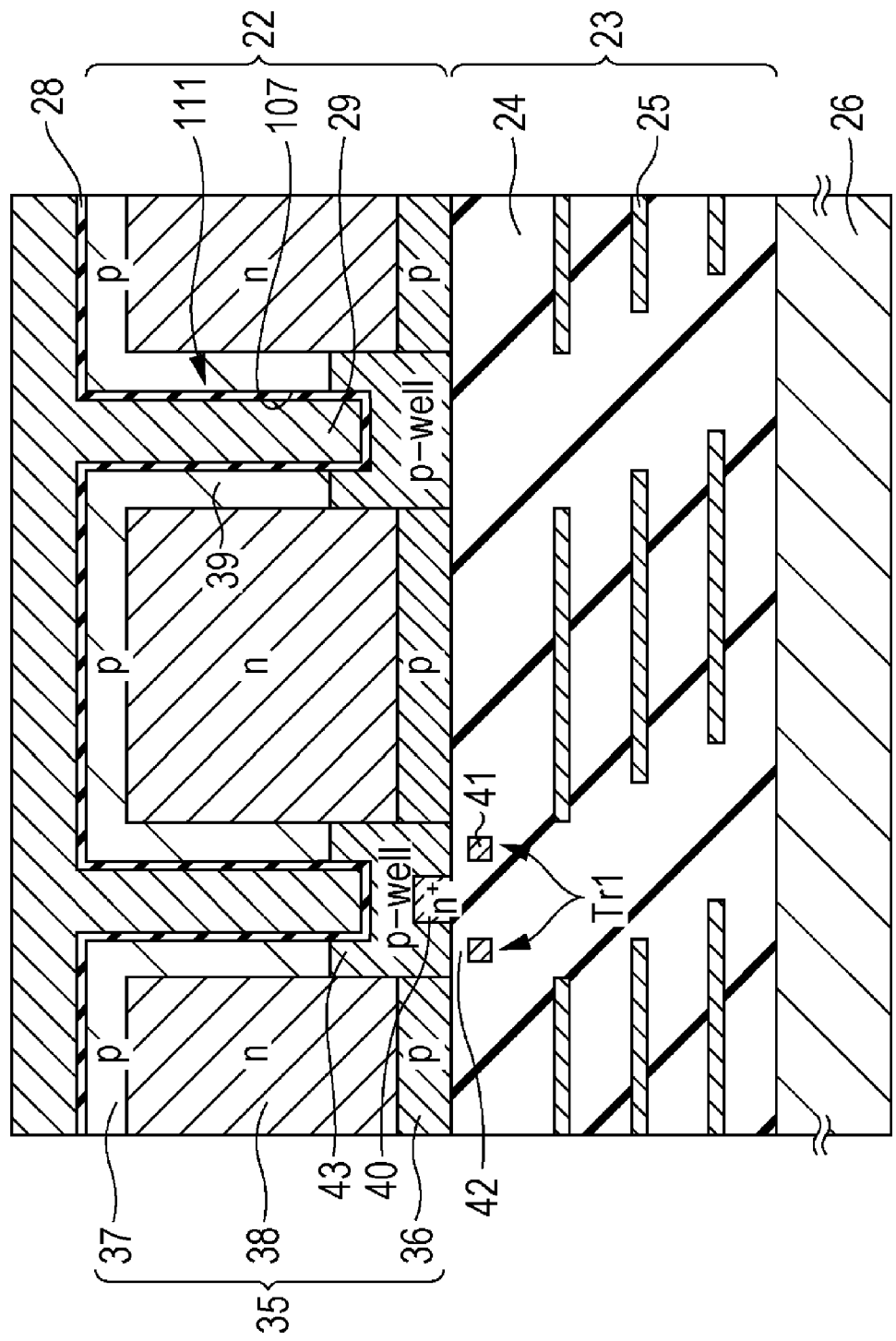
FIG. 19B is a process drawing (1 of 2) that shows a method for producing a solid-state imaging device according to the third embodiment of the present disclosure.

Next, as shown in FIG. 19B, the hard mask 65 that was used in the processing of the groove section 107 is removed, and the fixed charge film 28 is formed so as to cover the inner wall surface of the groove section 107 and the back surface of the substrate 22. This fixed charge film 28 is formed in the same manner as that of the first embodiment. Thereafter, in addition to forming the embedded film 29 embedded in the groove section 27, the embedded film 29 is also formed on the upper surface of the fixed charge film 28 on the back surface side of the substrate 22.

Figure 20C:
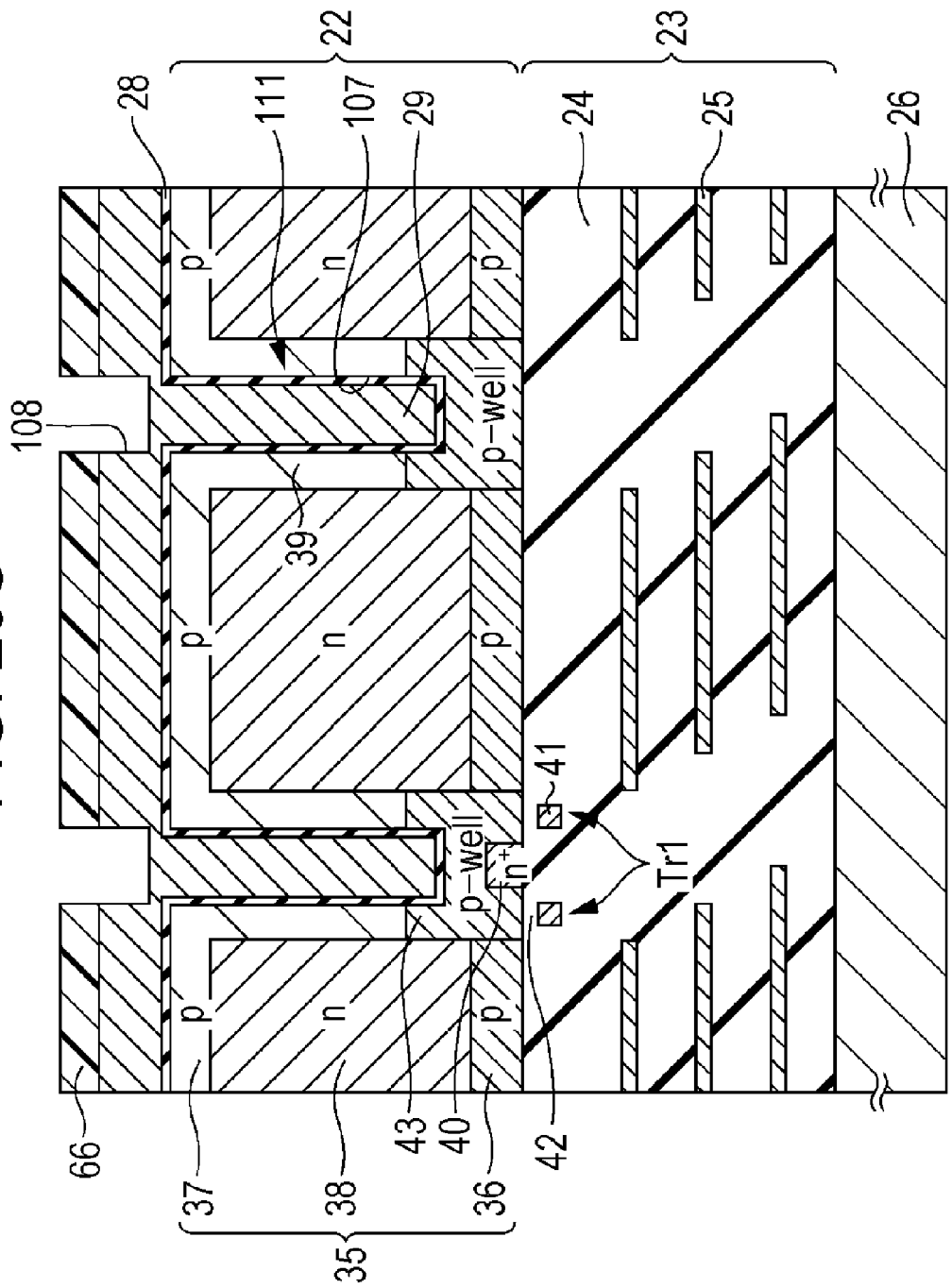
FIG. 20C is a process drawing (2 of 2) that shows a method for producing a solid-state imaging device according to the third embodiment of the present disclosure.

Nest, as shown in FIG. 20C, after the photoresist 66 has been formed above the embedded film 29, a concave portion 108 is formed in the embedded film 29 above the open end of the groove section 107 by lithography or dry etching for example.

Figure 20D:
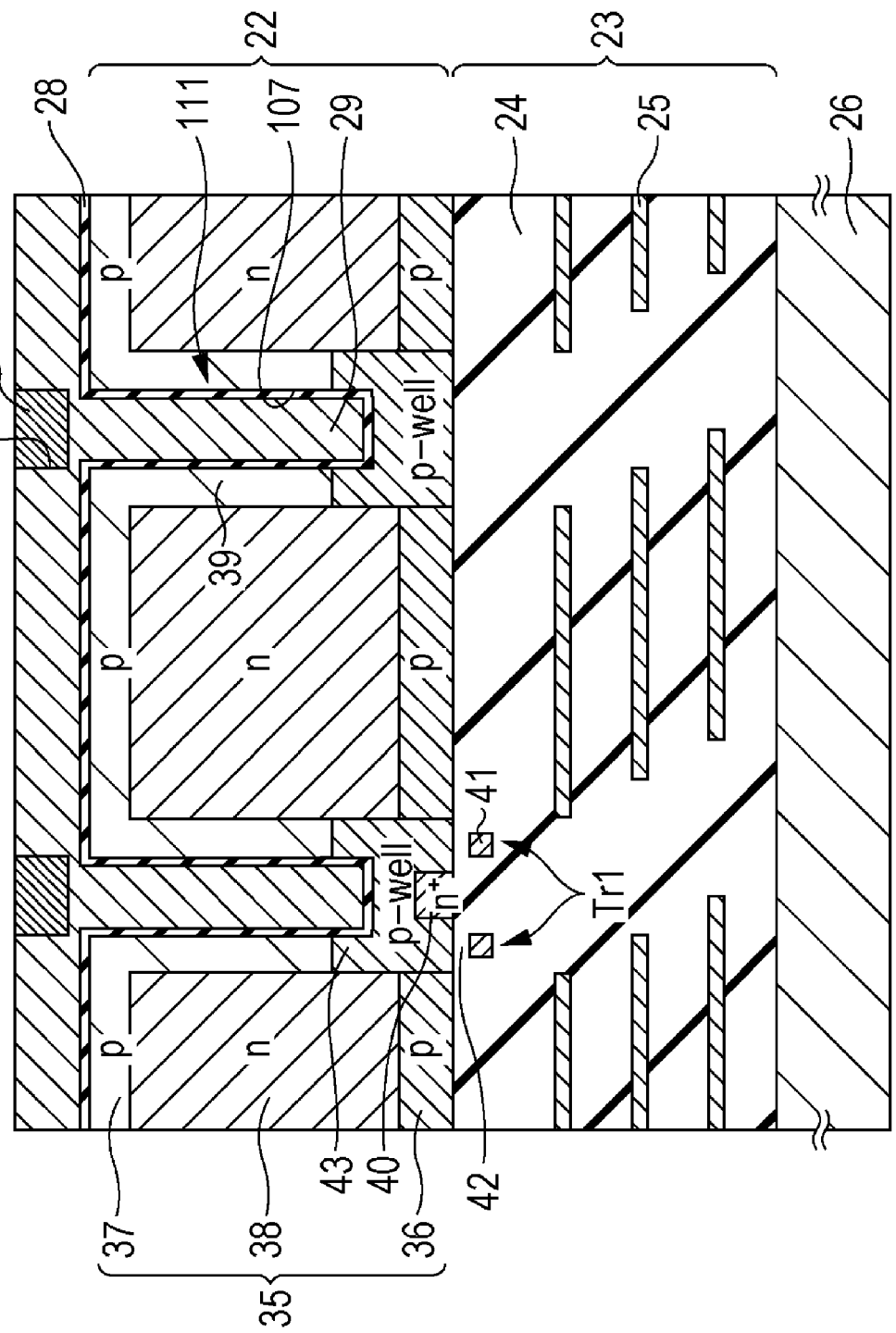
FIG. 20D is a process drawing (2 of 2) that shows a method for producing a solid-state imaging device according to the third embodiment of the present disclosure.

Next, a light shielding material layer is formed across the entire upper surface of the embedded film 29, and the light shielding material layer other than the light shielding material layer that is formed inside the groove section 107 is removed by etch back. As a result of this, as shown in FIG. 20D, the light shielding film 100 is only formed inside the groove section 107. Thereafter, the solid-state imaging device 101 shown in FIG. 18 is completed by forming the color filter layer 33.

In the solid-state imaging device 101 according to the present embodiment, the light shielding film 100 is formed above the open end of the groove section 107 that is provided on the substrate 22 and embedded in the embedded film 29. As a result of this, it is possible to obtain the same effects as those of the first embodiment such as the ability to reduce optical color mixing as a result of diagonal input light.

3-3 Modification Example

Next, an example of a solid-state imaging device, which can collect light by isolating the color filter layer 33 with a light shielding film 110 even if the collecting lens is not provided will be described as a solid-state imaging device 121 according to a modification example of the present embodiment. FIG. 21 is a cross section configuration drawing of the main portions of a solid-state imaging device according to a modification example. In FIG. 21, portions that correspond to FIG. 9 are given the same reference symbols and duplicate description thereof has been omitted.

As shown in FIG. 21, in the modification example, the light shielding film 110 is formed above the fixed charge film 28 and the embedded film 29 that are embedded one by one in the groove section 107 that is formed on the back surface side of the substrate 22, and is formed in the same layer as the color filter layer 33. In addition, the light shielding film 110 is disposed so as to shield light at the border regions between adjacent pixels 2 (between adjoining photoelectric conversion sections 35). Furthermore, the light shielding film 110 is provided above the open end of the groove section 107 provided on the substrate 22, and is formed embedded in the embedded film 29.

In addition, the color filter layer 33 is formed on the upper surface of the embedded film 29 and in the same layer as the light shielding film 110, and for example, is formed to correspond to R (red), G (green) and B (blue) for each pixel. In the color filter layer 33, light of a predetermined wavelength is transmitted, and the transmitted light is input into the photoelectric conversion section 35 of the substrate 22.

Since it is also possible to collect light even if the collecting lens is not provided by isolating the color filter layer 33 with the light shielding film 110 in the solid-state imaging device 121 that uses such a configuration, pupil correction is not necessary, and an improvement in spectrum, light focusing and sensitivity can be achieved.

In addition to the above, it is possible to obtain the same effects as those of the first embodiment.

In the solid-state imaging devices according to the abovementioned first to third embodiments, configurations were described using CMOS solid-state imaging devices as an example, but application in a backside-illuminated CCD solid-state imaging device is also possible. In such a case, it is possible to obtain the same effects as those in the abovementioned first to third embodiments by forming the light shielding film so that at least a portion thereof is embedded in the embedded film that is embedded in the groove section and the like.

4. Fourth Embodiment: Electronic Apparatus

Next, an electronic apparatus according to a fourth embodiment of the present disclosure will be described. FIG. 22 is a cross section configuration drawing of an electronic apparatus according to a fourth embodiment of the present disclosure. An electronic apparatus 131 of the present embodiment includes a solid-state imaging device 134, an optical lens 132, a mechanical shutter 133, a drive circuit 136 and a signal processing circuit 135. The electronic apparatus 131 of the present embodiment shows an embodiment of a case in which the abovementioned solid-state imaging device 1 in the first embodiment of the present disclosure is used in an electronic apparatus (a camera) as the solid-state imaging device 134.

The optical lens 132 provides images of image light (input light) from a photographic subject on an imaging surface of the solid-state imaging device 134. As a result of this, a corresponding signal charge is stored inside the solid-state imaging device 134 for a fixed period. The mechanical shutter 133 controls the light irradiation periods and the light shielding periods of the solid-state imaging device 134. The drive circuit 136 supplies a drive signal that controls the transfer operation of the solid-state imaging device 134. The signal transfer of the solid-state imaging device 134 is performed as a result of the drive signal (timing signal) that is supplied from the drive circuit 136. The signal processing circuit 135 performs various signal processes. An image signal on which signal processing has been performed is recorded in a recording medium such as memory or is output to a monitor.

In the solid-state imaging device 134 of the electronic apparatus 131, electronic color mixing (suppression of blooming) due to the element isolation section that is formed in a deep position. In addition, it is possible to reduce optical color mixing as a result of diagonal input light as a result of the light shielding film being formed so as to be embedded in the embedded film that is embedded in the groove section. Furthermore, it is possible to suppress deteriorations in image quality and the generation of a dark current that result from the influence of film stress by setting the depth of the embedding of the light shielding film above the open end of the groove section.

The electronic apparatuses 131 in which the solid-state imaging device 134 can be applied are not limited to cameras, and application in digital cameras, and imaging apparatuses such as camera modules for mobile apparatuses of mobile phones and the like is also possible.

In the present embodiment, a configuration which uses the solid-state imaging device 1 in the first embodiment as the solid-state imaging device 134 is used, but it is also possible to use solid-state imaging devices produced using the abovementioned second or third embodiments.

The present disclosure has been described by showing embodiments thereof in the abovementioned first to fourth embodiments, but the present disclosure is not limited thereto, and various modifications are possible provided they are within a range that does not deviate from the object of the disclosure. In addition, it is also possible to configure the present disclosure using a combination of the configurations according to the first to fourth embodiments.

Additionally, the present disclosure can have the following configurations.

(1)

A solid-state imaging device including a substrate, a plurality of photoelectric conversion sections that are provided on the substrate, a groove section that has an uneven section provided such that the width of the opening thereof becomes smaller in the depth direction of the substrate, and an element isolation section which is provided between adjacent photoelectric conversion sections and includes an embedded film which is embedded in the groove section so as to cover the inner wall surface of the groove section and a light shielding film which is provided directly above the groove section and at least a portion of which is embedded in the embedded film.

(2)

The solid-state imaging device according to (1), in which the element isolation section is formed in a grid so as to surround each photoelectric conversion section.

(3)

The solid-state imaging device according to (1) or (2), in which the uneven sections are only provided in the inner wall surfaces of groove sections that are positioned between photoelectric conversion sections that are adjacent in the horizontal direction and the vertical direction, and the groove sections are provided such that the width of the open ends of groove sections that are positioned between photoelectric conversion sections that are adjacent in the horizontal direction and the vertical direction is substantially the same as the width of the open ends of groove sections that are positioned between photoelectric conversion sections that are adjacent in the diagonal direction.

(4)

The solid-state imaging device according to any one of (1) to (3), in which the light shielding film is formed in a section that is above the open end of the groove section which is provided on the substrate.

(5)

The solid-state imaging device according to any one of (1) to (4), in which the light shielding film is disposed so as to shield light at the border regions between adjoining photoelectric conversion sections, and the depth at which the light shielding film is embedded in embedded films that are positioned between photoelectric conversion sections that are adjacent in the horizontal direction and the vertical direction becomes substantially the same as the depth at which the light shielding film is embedded in embedded films that are positioned between photoelectric conversion sections that are adjacent in the diagonal direction.

(6)

The solid-state imaging device according to any one of (1) to (5), in which a film that is contact with the inner wall surface of the groove section has a fixed charge.

(7)

The solid-state imaging device according to any one of (1) to (6), in which the solid-state imaging device includes a color filter layer that is disposed on top of the substrate for each pixel, and the light shielding film is provided so as to define the color filter layer for each pixel.

(8)

The solid-state imaging device according to any one of (1) to (7), in which the film that has a fixed charge is formed using hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holmium oxide, erbium oxide, thulium oxide, ytterbium oxide, lutetium oxide, yttrium oxide, hafnium nitride, aluminum nitride, hafnium oxynitride or aluminum oxynitride.

(9)

The solid-state imaging device according to any one of (1) to (8), in which the light shielding film is formed using aluminum, tungsten, copper or carbon black.

(10)

A method for producing a solid-state imaging device including step of forming a plurality of photoelectric conversion sections on the substrate, a step of forming a groove section that has an uneven section provided such that the width of the opening thereof becomes smaller in the depth direction of the substrate between adjacent photoelectric conversion sections, and a step of forming an element isolation section which includes an embedded film which is embedded in the groove section so as to cover the inner wall surface of the groove section and a light shielding film which is provided directly above the groove section and at least a portion of which is embedded in the embedded film.

(11)

The method for producing a solid-state imaging device according to (10), in which the element isolation section is formed in a grid so as to surround each photoelectric conversion section.

(12)

The method for producing a solid-state imaging device according to (10) or (11), in which the uneven sections are only provided in the inner wall surfaces of groove sections that are positioned between photoelectric conversion sections that are adjacent in the horizontal direction and the vertical direction, and the groove sections are formed such that the width of the open ends of groove sections that are positioned between photoelectric conversion sections that are adjacent in the horizontal direction and the vertical direction is substantially the same as the width of the open ends of groove sections that are positioned between photoelectric conversion sections that are adjacent in the diagonal direction.

(13)

The method for producing a solid-state imaging device according to any one of (10) to (12), in which the groove sections that have the uneven sections are formed using a plurality of etching processes using masks with different opening widths.

(14)

The method for producing a solid-state imaging device according to any one of (10) to (13), in which the light shielding film is formed so as to shield light at the border regions between adjoining photoelectric conversion sections, and the depth at which the light shielding film is embedded in embedded films that are positioned between photoelectric conversion sections that are adjacent in the horizontal direction and the vertical direction becomes substantially the same as the depth at which the light shielding film is embedded in embedded films that are positioned between photoelectric conversion sections that are adjacent in the diagonal direction.

(15)

The method for producing a solid-state imaging device according to any one of (10) to (14), in which the depth at which the light shielding film is embedded in the embedded film is adjusted by the film thickness of the embedded film that is formed in the groove section.

(16)

An electronic apparatus including a solid-state imaging device that includes a substrate, a plurality of photoelectric conversion sections that are provided on the substrate, a groove section that has an uneven section provided such that the width of the opening thereof becomes smaller in the depth direction of the substrate, and an element isolation section which is provided between adjacent photoelectric conversion sections and includes an embedded film which is embedded in the groove section so as to cover the inner wall surface of the groove section and a light shielding film which is provided directly above the groove section and at least a portion of which is embedded in the embedded film, and a signal processing circuit that processes output signals that are output by the solid-state imaging device.

(17)
A solid-state imaging device, comprising:
a substrate;
a plurality of pixels formed in the substrate;
a plurality of grooves formed in the substrate, wherein the grooves are located in pixel isolation regions between adjacent pixels, and wherein the grooves extend from a first surface of the substrate towards a second surface of the substrate; and
an embedded film that extends into the grooves, and wherein at least one of:
1) at least some of the grooves include a first stage nearer the first surface of the substrate and a second stage nearer the second surface of the substrate, wherein the first and second stages are defined by walls of the grooves, wherein the first stage is wider than the second stage, and wherein a step is present between the first and second stages; and
2) the device further includes a light shielding film adjacent the first surface of the substrate that overlies the grooves, and wherein at least a portion of the light shielding film is embedded in the embedded film that extends into the grooves.

(18)
The device of (17), further comprising:
a film, wherein the film is in contact with the walls of the grooves and the first surface of the substrate, and wherein the embedded film that extends into the grooves is in contact with the film.

(19)
The device of (18), wherein the film that is in contact with the walls of the grooves is a fixed charge film;

(20)
The device of (17), wherein the grooves include a first stage nearer the first surface of the substrate and a second stage nearer the second surface of the substrate, wherein the first and second stages are defined by walls of the grooves, wherein the first stage is wider than the second stage, and wherein a step is present between the first and second stages.

(21)
The device of (17), wherein the plurality of pixels are arranged in rows and columns, wherein the grooves have a first profile in groove portions between adjacent pixels in the same row or column, and wherein the grooves have a second profile in groove portions between diagonally adjacent pixels in different rows and columns.

(22)
The device of (21), wherein at least the grooves having the first profile include a first stage nearer the first surface of the substrate and a second stage nearer the second surface of the substrate, wherein the first stage is wider than the second stage, and wherein the first and second stages are tapered such that the width of each grooves decreases with distance from the first surface of the substrate.

(23)
The device of (22), wherein the grooves having the first profile and the grooves having the second profile include first and second stages, and wherein the at least the first stage of the first profile is wider than the first stage of the second profile.

(24)
The device of (22), wherein the device includes a light shielding film adjacent the first surface of the substrate that overlies the grooves, and wherein at least a portion of the light shielding film is embedded in the embedded film that extends into the grooves.

(25)
The device of (24), wherein the grooves having the second profile include a first stage nearer the first surface of the substrate and a second stage nearer the second surface of the substrate, and wherein the light shielding film is embedded in the embedded film by a first distance with respect to grooves having the first profile and a second distance with respect to grooves having the second profile.

(26)
The device of (24), wherein the embedded film has a first width with respect to grooves having the first profile and a second distance with respect to grooves having the second profile.

(27)
The device of (17), wherein the device includes a light shielding film adjacent the first surface of the substrate that overlies the grooves, and wherein at least a portion of the light shielding film is embedded in the embedded film that extends into the grooves.

(28)
The device of (19), wherein the embedded film is formed from a material that has a refractive index that is different from that of the fixed charge film.

(29)
The device of (17), wherein the embedded film is formed from at least one of silicon oxide, silicon nitride, silicon oxynitride, and a resin.

(30)
The device of (17), wherein the embedded film is formed from a material that has a small positive fixed charge.

(31)
An electronic apparatus, comprising:
a solid-state imaging device; and
a signal processor which receives signal from the solid-state imaging device,
the solid-state imaging device comprising:
a substrate;
a plurality of pixels formed in the substrate;
a plurality of grooves formed in the substrate, wherein the grooves are located between adjacent pixels, and wherein the grooves extend from a first surface of the substrate towards a second surface of the substrate;
a film that extends into and contacts walls of the grooves and that lies on the first surface of the substrate; and
an embedded film that extends into the grooves and that is in contact with the film that extends into and contacts walls of the grooves and that lies on the first surface of the substrate, and wherein at least one of:
1) at least some of the grooves include a first stage nearer the first surface of the substrate and a second stage nearer the second surface of the substrate, wherein the first stage is wider than the second stage; and
2) the device further includes a light shielding film adjacent the first surface of the substrate that overlies the grooves, and wherein at least a portion of the light shielding film is embedded in the embedded film that extends into the grooves.

(32)
The apparatus of (31), wherein the film that extends into and contacts walls of the grooves is formed from at least one of a hafnium oxide, an aluminum oxide, a zirconium oxide, a tantalum oxide, a titanium oxide, lanthanum oxide, praseodymium oxide, cerium oxide, neodymium oxide, promethium oxide, samarium oxide, europium oxide, gadolinium oxide, terbium oxide, dysprosium oxide, holmium oxide, erbium oxide, thulium oxide, ytterbium oxide, lutetium oxide and yttrium oxide.

(33)

A method of producing a solid-state imaging device, comprising:
forming a plurality of photoelectric conversion sections in a first substrate;
forming a wiring layer on a front surface of the first substrate;
forming a second substrate on the wiring layer;
forming a groove section from a back surface of the first substrate;
forming a dielectric film, wherein the dielectric film covers walls of the groove and the back surface of the first substrate;
forming an embedded film over the dielectric film;
forming a light shielding film at least over the embedded film in the groove;
and
forming at least one of:
1) an uneven section in the groove section, where at least one step is formed in the groove section; and
2) a buried portion of the light shielding film in the embedded film.

(34)

The method of (33), further comprising:
forming an uneven section in the groove section, where at least one step is formed in the groove section.

(35)

The method of (34), further comprising:
forming a buried portion of the light shielding film in the embedded film.

(36)

The method of (35), wherein photo electric conversion sections are arranged in a two-dimensional matrix, wherein the groove section has a first profile between photo electric conversion sections disposed in a horizontal or in a vertical direction, and wherein the groove section has a second profile between photo electric conversion elements disposed diagonally.

(37)

The method of (36), wherein the embedded film is formed from at least one of silicon oxide, silicon nitride, silicon oxynitride, a resin, a material that has a small positive fixed charge, and a material that does not have a positive fixed charge.

The present disclosure contains subject matter related to that disclosed in Japanese Priority Patent Application JP 2012-173188 filed in the Japan Patent Office on Aug. 3, 2012, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 1, 51, 71, 91, 101, 121, 134 solid-state imaging device
2 pixels
3 pixel region
4 vertical drive circuit
5 column signal processing circuit
6 horizontal drive circuit
7 output circuit
8 control circuit
9 vertical signal line
10 horizontal signal line
11, 22, 32 substrate
15 uneven section
23 wiring layer
24 interlayer insulation film
25 wiring, 26 support substrate
27, 52, 87a, 87b, 107 groove section
28 fixed charge film
29 embedded film
30, 60, 80, 90a, 90b, 100, 110 light shielding film
31, 53, 81a, 81b, 111 element isolation section
32 planarizing film
33 color filter layer
34 collecting lens
35 photoelectric conversion section
36, 37 p-type semiconductor region
38 n-type semiconductor region
39 pixel isolation layer
40 source and drain region
41 gate electrode
42 gate insulation film
43 p-well layer
44, 108 concave section
65 hard mask
66 photoresist
95 semiconductor chip
96 guard ring
131 electronic apparatus
132 optical lens
133 mechanical shutter
135 signal processing circuit
136 drive circuit

What is claimed is:
1. An imaging device, comprising:
a substrate, comprising:
a photoelectric conversion section;
a first groove section disposed in the substrate and including a first portion and a second portion;
a second groove section in the substrate and including a third portion and a fourth portion;
a fixed charge film disposed, at least in part, in the first groove section and the second groove section;
an intermediate layer disposed, at least in part, on the fixed charge film;
a first light-shielding film that contacts a first part of the intermediate layer such that the first light-shielding film is disposed over a top most surface of the intermediate layer at the first groove section;
a second light-shielding film that contacts a second part of the intermediate layer such that the second light-shielding film is disposed over the top most surface of the intermediate layer at the second groove section; and
a planarizing film disposed over the intermediate layer and surrounding the first light-shielding film and the second light-shielding film,
wherein,
the photoelectric conversion section is disposed between the first groove section and the second groove section,
a width of the first portion is larger than a width of the second portion in a cross-section view,
a width of the third portion is larger than a width of the fourth portion in the cross-section view,
the fixed charge film extends from the first groove section to the second groove section along a first side of the substrate; and
at least a portion of the first and the second light-shielding films extend below a bottom surface of the planarizing film.

2. The imaging device of claim 1, wherein the fixed charge film is in contact with walls of the first groove section, walls of the second groove section, and the first side of the substrate, and wherein the intermediate layer is in contact with the fixed charge film.

3. The imaging device of claim 1, wherein a plurality of pixels are arranged in rows and columns and each pixel in the plurality of pixels includes the photoelectric conversion section, wherein grooves of the first groove section and the second groove section have a first profile in groove portions between adjacent pixels in the same row or column, and wherein grooves of the first groove section and the second groove section have a second profile in groove portions between diagonally adjacent pixels in different rows and columns, the first profile being different than the second profile.

4. The imaging device of claim 3, wherein a side wall of the first groove section and a side wall of the second groove section each have a tapered shape.

5. The imaging device of claim 4, wherein the at least the portion of the first light-shielding film extends below the bottom surface of the planarizing film by a first distance in the grooves having the first profile, and wherein the at least the portion of the second light-shielding film extends below the bottom surface of the planarizing film by a second distance in the grooves having the second profile.

6. The imaging device of claim 4, wherein the intermediate layer has a first width in the grooves having the first profile, and wherein the intermediate layer has a second width in the grooves having the second profile.

7. The imaging device of claim 1, wherein the intermediate layer comprises a material that has a refractive index that is different from that of the fixed charge film.

8. The imaging device of claim 1, wherein the intermediate layer comprises at least one of silicon oxide, silicon nitride, silicon oxynitride, and a resin.

9. The imaging device of claim 1, wherein the intermediate layer comprises a material that has a small positive fixed charge.

10. The imaging device of claim 1, further comprising a first step between the first portion and the second portion, and a second step between the third portion and the fourth portion.

11. The imaging device of claim 1, wherein the fixed charge film is selected from the group consisting of a hafnium oxide, an aluminum oxide, a zirconium oxide, a tantalum oxide, a titanium oxide, lanthanum oxide, praseodymium oxide, cerium oxide, neodymium oxide, promethium oxide, samarium oxide, europium oxide, gadolinium oxide, terbium oxide, dysprosium oxide, holmium oxide, erbium oxide, thulium oxide, ytterbium oxide, lutetium oxide and yttrium oxide.

12. The imaging device of claim 4, wherein the first light-shielding film and the second light-shielding film are each selected from the group consisting of a tungsten, aluminum, copper and carbon black.

13. An electronic apparatus, comprising:
an imaging device; and
a signal processor which receives signals from the imaging device,
the imaging device comprising:
a substrate;
a photoelectric conversion section;
a first groove section disposed in the substrate and including a first portion and a second portion;
a second groove section in the substrate and including a third portion and a fourth portion;
a fixed charge film disposed, at least in part, in the first groove section and the second groove section;
an intermediate layer disposed, at least in part, on the fixed charge film;
a first light-shielding film that contacts a first part of the intermediate layer such that the first light-shielding film is disposed over a top most surface of the intermediate layer at the first groove section;
a second light-shielding film that contacts a second part of the intermediate layer such that the second light-shielding film is disposed over the top most surface of the intermediate layer at the second groove section; and
a planarizing film disposed over the intermediate layer and surrounding the first light-shielding film and the second light-shielding film,
wherein,
the photoelectric conversion section is disposed between the first groove section and the second groove section,
a width of the first portion is larger than a width of the second portion in a cross-section view,
a width of the third portion is larger than a width of the fourth portion in the cross-section view,
the fixed charge film extends from the first groove section to the second groove section along a first side of the substrate; and
at least a portion of the first and the second light-shielding films extend below a bottom surface of the planarizing film.

14. The apparatus of claim 13, wherein the fixed charge film is selected from the group consisting of a hafnium oxide, an aluminum oxide, a zirconium oxide, a tantalum oxide, a titanium oxide, lanthanum oxide, praseodymium oxide, cerium oxide, neodymium oxide, promethium oxide, samarium oxide, europium oxide, gadolinium oxide, terbium oxide, dysprosium oxide, holmium oxide, erbium oxide, thulium oxide, ytterbium oxide, lutetium oxide and yttrium oxide.

15. A method of manufacturing an imaging device, comprising:
forming a photoelectric conversion section in a substrate;
forming a first groove section formed in the substrate and including a first portion and a second portion;
forming a second groove section in the substrate and including a third portion and a fourth portion;
forming a fixed charge film disposed, at least in part, in the first groove section and the second groove section;
forming an intermediate layer disposed, at least in part, on the fixed charge film;
forming a first light-shielding film that contacts a first part of the intermediate layer such that the first light-shielding film is disposed over a top most surface of the intermediate layer at the first groove section;
forming a second light-shielding film that contacts a second part of the intermediate layer such that the second light-shielding film is disposed over the top most surface of the intermediate layer at the second groove section; and
a planarizing film disposed over the intermediate layer and surrounding the first light-shielding film and the second light-shielding film,
wherein,
the photoelectric conversion section is disposed between the first groove section and the second groove section,
a width of the first portion is larger than a width of the second portion in a cross-section view,
a width of the third portion is larger than a width of the fourth portion in the cross-section view, the fixed charge film extends from the first groove section to the second groove section along a first side of the substrate; and at least a portion of the first and the second light-shielding films extend below a bottom surface of the planarizing film.

16. The method of claim 15, further comprising:
forming an uneven section in the first groove section and the second groove section such that at least one step is formed in the first groove section and the second groove section.

17. The method of claim 15, wherein a side wall of the first groove section and a side wall of the second groove section each have a tapered shape.

18. The method of claim 17, wherein a plurality of pixels are arranged in a two-dimensional matrix and each pixel in the plurality of pixels include the photoelectric conversion section, wherein grooves of the first groove section and the second groove section have a first profile between pixels disposed in a horizontal or in a vertical direction, and wherein grooves of the first groove section and the second groove section have a second profile between pixels disposed in a diagonal direction.

19. The method of claim 18, wherein the intermediate layer is formed from at least one of silicon oxide, silicon nitride, silicon oxynitride, a resin, a material that has a small positive fixed charge, and a material that does not have a positive fixed charge.

* * * * *